US012786590B2

(12) United States Patent
Jin et al.

(10) Patent No.: US 12,786,590 B2
(45) Date of Patent: Nov. 3, 2026

(54) IMAGE SENSOR AND CAMERA MODULE INCLUDING THE SAME

(71) Applicant: Samsung Electronics Co., Ltd., Suwon-si (KR)

(72) Inventors: Younggu Jin, Suwon-si (KR); Youngsun Oh, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 40 days.

(21) Appl. No.: 18/973,594

(22) Filed: Dec. 9, 2024

(65) Prior Publication Data

US 2025/0203243 A1 Jun. 19, 2025

(30) Foreign Application Priority Data

Dec. 15, 2023 (KR) ........................ 10-2023-0182949

(51) Int. Cl.
*H04N 25/771* (2023.01)
*H10F 39/00* (2025.01)

(52) U.S. Cl.
CPC ....... *H04N 25/771* (2023.01); *H10F 39/8027* (2025.01); *H10F 39/807* (2025.01)

(58) Field of Classification Search
CPC .. H04N 25/771; H10F 39/807; H10F 39/8027
See application file for complete search history.

(56) References Cited

U.S. PATENT DOCUMENTS

| | | | |
|---|---|---|---|
| 10,708,522 B2 | 7/2020 | Zhang et al. | |
| 11,195,580 B2 | 12/2021 | Jaiswal et al. | |
| 11,388,356 B1 | 7/2022 | Mn et al. | |
| 11,460,559 B2 | 10/2022 | Ben Shem | |
| 11,467,264 B2 | 10/2022 | Choi et al. | |
| 11,468,146 B2 | 10/2022 | Jaiswal et al. | |
| 2024/0073556 A1* | 2/2024 | Suess | H04N 25/67 |

FOREIGN PATENT DOCUMENTS

| | | |
|---|---|---|
| CN | 111669527 A | 9/2020 |
| WO | 2023/085138 A1 | 5/2023 |

* cited by examiner

*Primary Examiner* — Georgia Y Epps
*Assistant Examiner* — Don J Williams
(74) *Attorney, Agent, or Firm* — Fish & Richardson P.C.

(57) ABSTRACT

An image sensor, and a camera module that includes the image sensor, the image sensor including a plurality of pixels. Each of the plurality of pixels includes a photodiode that generates an electric charge based on a received optical signal and a plurality of taps. Each of the plurality of taps includes a transfer transistor, a floating diffusion node, a first source follower, a first switch, a second switch, a first capacitor, and a second source follower.

20 Claims, 21 Drawing Sheets

IMAGE SENSOR AND CAMERA MODULE INCLUDING THE SAME

CROSS-REFERENCE TO RELATED APPLICATION

This application is based on and claims priority under 35 U.S.C. § 119 to Korean Patent Application No. 10-2023-0182949, filed on Dec. 15, 2023, in the Korean Intellectual Property Office, the disclosure of which is incorporated by reference herein in its entirety.

BACKGROUND

The present disclosure relates to image sensors, and more particularly, to camera modules including image sensors having multi-tap structure.

Recently, the demand for using artificial intelligence (AI) systems has increased to efficiently perform high-quality image processing or big data processing. To this end, image data generated by an image sensor has to be filtered or converted into metadata, and image processing or information processing may be efficiently performed by using a neural network processor. Deep learning or machine learning for image processing may be implemented based on a neural network.

For example, AI systems may learn various images by using a deep neural network (for example, a convolution neural network (CNN) where a layer is deep) and may generate an image processing model based on a learning result. Also, when a new image is received through a process similar to learning, an image may be provided through filtering and classification based on a generated image model.

However, as a level of an image processing model increases, the amount of data requiring processing increases exponentially, and power consumption caused by the transfer and reception of data between a processor and an image signal processor also increases.

SUMMARY

The inventive concepts provide an image sensor and a camera module, wherein the image sensor may include pixels having a multi-tap structure to support various convolution neural network (CNN) operation functions in an image signal processor.

Some example embodiments of the inventive concepts provide an image sensor that includes a plurality of pixels. Each of the plurality of pixels includes a photodiode and a plurality of taps, the photodiode generating an electric charge in response to a received optical signal. Each of the plurality of taps includes a transfer transistor having a first terminal connected to the photodiode, the transfer transistor turning on in response to a transfer gate signal; a floating diffusion node connected to a second terminal of the transfer transistor, the floating diffusion node accumulating photocharges generated by the photodiode; a first source follower amplifying a voltage of the floating diffusion node and outputting an amplified voltage; a first switch having a first terminal connected to the first source follower, and a second terminal connected to a first node; a second switch having a first terminal connected to the first node, and a second terminal connected to a second node; a first capacitor having a first terminal connected to the second switch, the first capacitor storing the photocharges based on the amplified voltage; and a second source follower having a gate terminal connected to the second node.

Some example embodiments of the inventive concepts further provide an image sensor that includes a pixel array including a plurality of pixels. Each of the plurality of pixels including a plurality of taps. Each of the plurality of taps includes a transfer transistor having a first terminal connected to a photodiode, the transfer transistor turning on in response to a transfer gate signal; a floating diffusion node connected to a second terminal of the transfer transistor, the floating diffusion node accumulating photocharges generated by the photodiode; a first source follower amplifying a voltage of the floating diffusion node and outputting an amplified voltage; a first switch having a first terminal connected to the first source follower, and a second terminal connected to the first node; a second switch having a first terminal connected to the first node, and a second terminal connected to a second node; a first capacitor having a first terminal connected to the second switch, the first capacitor storing the photocharges based on the amplified voltage; and a second source follower having a gate terminal connected to the second node. During an integration period, each tap controls an on/off ratio of the transfer gate signal to control an output voltage of each of the plurality of taps.

Some example embodiments of the inventive concepts still further provide a camera module that includes an image sensor and an image signal processor. The image sensor includes a pixel including a first tap and a second tap. The first tap includes a first transfer transistor connected to a first floating diffusion node, the first transfer transistor turning on in response to a first transfer gate signal; a first source follower amplifying a voltage of the first floating diffusion node and outputting a first amplified voltage; a first switch having a first terminal connected to the first source follower, and a second terminal connected to a first node; a second switch having a first terminal connected to the first node, and a second terminal connected to a second node; a first capacitor having a first terminal connected to the second switch, the first capacitor storing photocharges based on the first amplified voltage; and a second source follower having a gate terminal connected to the second node. The second tap includes a second transfer transistor connected to a second floating diffusion node, the second transfer transistor turning on in response to a second transfer gate signal; a third source follower amplifying a voltage of the second floating diffusion node and outputting a second amplified voltage; a third switch having a first terminal connected to the third source follower, and a second terminal connected to a third node; a fourth switch having a first terminal connected to the third node, and a second terminal connected to a fourth node; a second capacitor having a first terminal connected to the fourth switch, the second capacitor storing the photocharges based on the second amplified voltage; and a fourth source follower having a first terminal connected to the fourth node. During an integration period, output voltages of the first tap and the second tap are controlled by controlling on/off ratios of the first transfer gate signal and the second transfer gate signal.

BRIEF DESCRIPTION OF THE DRAWINGS

Example embodiments will be more clearly understood from the following detailed description taken in conjunction with the accompanying drawings in which.

DETAILED DESCRIPTION

Hereinafter, some example embodiments will be described in detail with reference to the accompanying drawings.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes. When ranges are specified, the range includes all values therebetween such as increments of 0.1%.

Also, for example, "at least one of A, B, and C" and similar language (e.g., "at least one selected from the group consisting of A, B, and C") may be construed as A only, B only, C only, or any combination of two or more of A, B, and C, such as, for instance, ABC, AB, BC, and AC.

Figure 1:
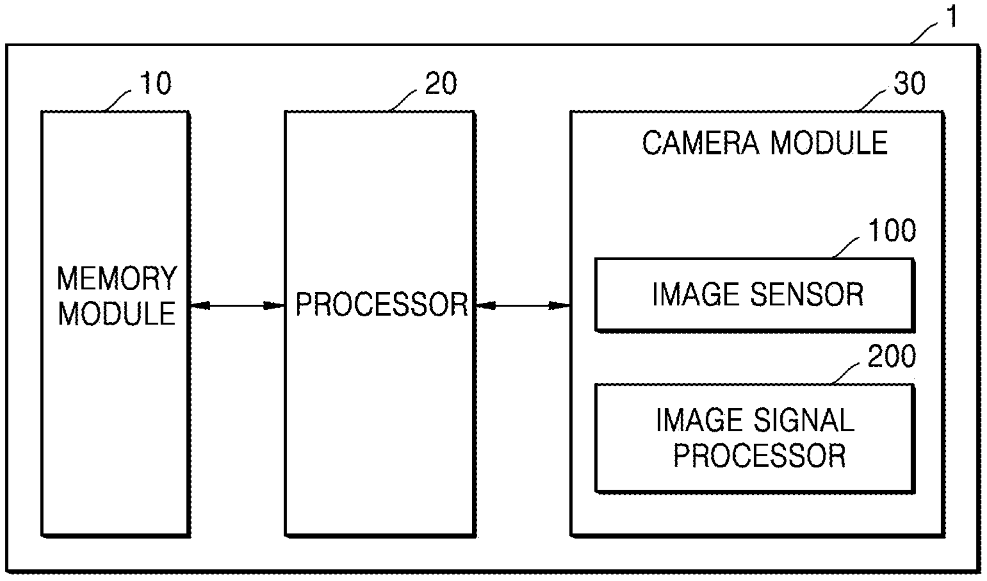
FIG. 1 is a diagram for describing a system according to some example embodiments of the inventive concepts.

FIG. 1 is a diagram for describing a system 1 according to some example embodiments of the inventive concepts.

Referring to FIG. 1, the system 1 may include a processor 20 and a camera module 30. The system 1 may further include a memory module 10 which is connected to the processor 20 and stores information such as image data received from the camera module 30. In some example embodiments, the system 1 may be integrated into one semiconductor chip, and each of the camera module 30, the processor 20, and the memory module 10 may be implemented as a separate semiconductor chip. The memory module 10 may include one or more memory chips. In some example embodiments, the processor 20 may include multiple processing chips. In some example embodiments, unlike the illustration of FIG. 1, the processor 20 and the memory module 10 may be included in the camera module 30.

The system 1 may be an electronic device including an image sensor according to some example embodiments. The system 1 may be portable or stationary. Examples of a portable type of the system 1 may include mobile devices, cellular phones, smartphones, user equipment (UE), tablet computers, digital cameras, laptop or desktop computers, electronic smart watches, machine-to-machine (M2M) communication devices, virtual reality (VR) devices or modules, and robots. Examples of a stationary type of the system 1 may include a game console of a game room, interactive video terminals, vehicles, machine vision system, industrial robots, VR devices, and driver-side mounted cameras of vehicle.

The memory module 10 may be, for example, dynamic random-access memory (RAM) (DRAM) such as synchronous DRAM (SDRAM), a high bandwidth memory (HBM) module, or a DRAM-based 3-dimensional stack (3DS) memory module such as a hybrid memory cube (HMC) memory module. The memory module 10 may be, for example, a solid-state drive (SSD), a DRAM module, or semiconductor-based storage such as static RAM (SRAM), phase-change RAM (PRAM), resistive RAM (RRAM), conductive-bridging RAM (CBRAM), magnetic RAM (MRAM), or spin-transfer torque MRAM (STT-MRAM).

The memory module 10 may store an image processing model including a matrix where convolution neural network (CNN) learning has been performed based on image data including a plurality of images. The matrix learned from the image data may be variously referred to as a filter, a kernel, or a weight matrix, but for convenience of description, the matrix may be referred to as a matrix.

The processor 20 may be a central processing unit (CPU) which is a general-purpose processor. In some example embodiments, the processor 20 may further include a microcontroller, a digital signal processor (DSP), a graphics processing unit (GPU), a neural processing unit (NPU), and an application specific integrated circuit (ASIC) processor, in addition to the CPU. Also, the processor 20 may include more CPUs than one CPU, which operate in a distributed processing environment. In some example embodiments, the processor 20 may be a system on chip (SoC) having additional functions as well as a function of a CPU, or may be an application processor (AP) which is equipped in smartphones, tablet computers, and smart watches.

The processor 20 may control operations of the camera module 30. In some example embodiments, the system 1 may include a plurality of camera modules, and the processor 20 may be programmed in software or firmware, which performs various processing operations described. In some example embodiments, the processor 20 may include programmable hardware logic circuits for performing some or all of the functions described above. For example, the memory module 10 may store a program code, a lookup table, or intermediate operation results to enable the processor 20 to perform a corresponding function.

The camera module 30 may include an image sensor 100 and an image signal processor 200.

The image sensor 100 may receive an input image. For example, the image sensor 100 may receive the input image from the camera module 30. The image sensor 100 may include a pixel array, a control circuit (e.g., a controller) which drives the pixel array, and a readout circuit which reads out a pixel signal output from the pixel array. Functions of the pixel array and the readout circuit of the image sensor 100 will be described below with reference to FIG. 2.

The image signal processor 200 may perform image processing on the input image to generate an output image. For example, the image signal processor 200 may receive the input image generated from the image sensor 100 of the camera module 30 and may perform image processing operations on the input image to generate the output image. However, the inventive concepts are not limited thereto. The image signal processor 200 may perform an image processing operation on an input image pre-stored in the system 1 and may perform an image processing operation on an input image received from the outside of the system 1.

The image signal processor 200 may perform a neural network operation, based on the received input image. Furthermore, the image signal processor 200 may generate an information signal, based on a performance result of the neural network operation. The image signal processor 200 may be implemented with a neural network operation accelerator, a coprocessor, a DSP, an ASIC, a field-programmable gate array (FPGA), a GPU, an NPU, a tensor processing unit (TPU), and a multi-processor system-on-chip (MPSoC).

The image signal processor 200 may be based on at least one of artificial neural network (ANN), convolution neural network (CNN), region with convolution neural network (R-CNN), region proposal network (RPN), recurrent neural network (RNN), stacking-based deep neural network (S-DNN), state-space dynamic neural network (S-SDNN), deconvolution network, deep belief network (DBN), restricted Boltzman machine (RBM), fully convolutional network, long short-term memory (LSTM) network, classification network, plain residual network, dense network, and hierarchical pyramid network. However, the kind of image signal processor 200 is not limited to the example embodiments described above.

The image signal processor 200 may perform image processing on an image input from the image sensor 100 to generate an output image. The image signal processor 200 may perform image processing on the input image by using a neural network processor to generate the output image. The input image may be referred to as input image data or input data. The neural network processor may train (or learn) a neural network or may analyze input data by using the neural network, and thus, may infer information included in the input data. Based on the inferred information, the neural network processor may determine a situation, or may control elements of the system 1 equipped with the neural network processor.

The image signal processor 200 may receive the input image from the camera module 30 or the memory module 10 and may perform a neural network operation, based on the received input image. For example, the image signal processor 200 may perform a convolution operation on the matrix. Here, the convolution operation may perform a matrix multiplication while shifting the matrix for each matrix region and may calculate a result value based on the matrix multiplication. The image signal processor 200 may perform a trained matrix CNN operation.

However, in some example embodiments, the image signal processor 200 may not shift a matrix for each region, so as to perform a convolution operation. The image sensor 100 may include a plurality of pixels, and each of the plurality of pixels may have a multi-tap structure, thereby supporting various CNN operation functions of the image signal processor 200. Accordingly, a delay time caused by the transfer and reception of data between the processor 20 and the image signal processor 200 may be reduced and/or minimized.

Figure 2:
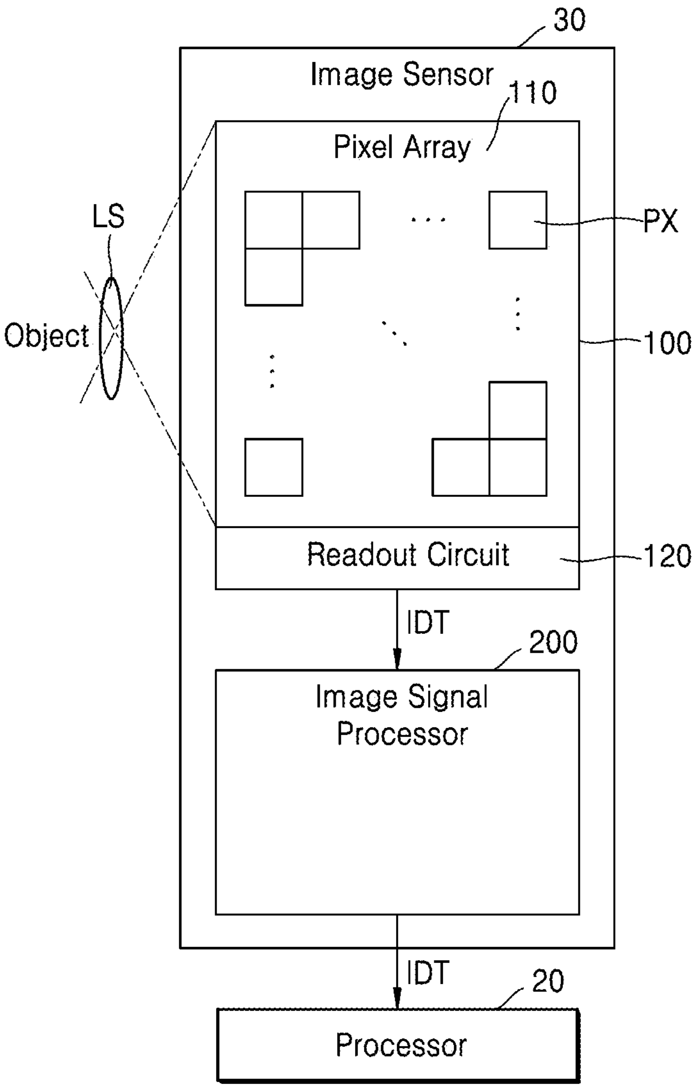
FIG. 2 is a diagram for describing a camera module according to some example embodiments.

FIG. 2 is a diagram for describing a camera module 30 according to some example embodiments.

Referring to FIG. 2, the camera module 30 may include an image sensor 100 and an image signal processor 200.

The image sensor 100 may convert an optical signal of an object, input through an optical lens LS, into image data. The image sensor 100 may include a pixel array 110 and a readout circuit 120. Furthermore, the image sensor 100 may further include a memory (not shown) which stores the image data, or temporarily stores data provided from the readout circuit 120 to the image signal processor 200. The memory may be implemented as a volatile memory or a non-volatile memory.

In some example embodiments, the pixel array 110, the readout circuit 120, and the image signal processor 200 may be implemented as one semiconductor chip or semiconductor module. In some example embodiments, the pixel circuit 110 and the readout circuit 120 may be implemented as one semiconductor chip, and the image signal processor 200 may be implemented as one other semiconductor chip.

The pixel array 110 may include a plurality of pixels PX which are two-dimensionally arranged, and each of the plurality of pixels PX may convert a received optical signal into an electrical signal to output as a pixel signal. The plurality of pixels PX may be referred to as a plurality of unit pixels PX, and a structure of each of the plurality of unit pixels PX will be described below with reference to FIGS. 3 to 13.

A plurality of row wirings extending in a row direction and a plurality of column wirings extending in a column direction may be connected to the plurality of pixels PX, control signals may be applied to the plurality of pixels PX through the plurality of row wirings, and pixel signals of the plurality of pixels PX may be output to the readout circuit 120 through the plurality of column wirings.

In some example embodiments, each of the plurality of pixels PX may include a multi-tap structure. Also, a tap may include a plurality of transistors for collecting and detecting photocharges. Also, the tap may denote a unit circuit which distributes and transfers, by phases, photocharges which are generated and accumulated in a unit pixel as a received optical signal is irradiated thereon.

The pixel array 110 according to some example embodiments may include a plurality of pixels PX, and each of the plurality of pixels PX may have a multi-tap structure. Because the pixel array 110 has the multi-tap structure, various CNN operation functions of the image signal processor 200 may be supported, capacitors of the plurality of pixels PX may be used as a memory, and the number of operations may be distributed to the image signal processor 200, thereby decreasing the amount of data movement between the processor 20 and the image signal processor 200 and reducing and/or minimizing power consumption.

The image sensor 100 may further include a controller. The controller may select the plurality of pixels PX by row units and may drive the selected pixels PX. The controller may generate control (driving) signals for driving each row, and the driving signals may include, for example, a reset signal RS, a transfer gate signal TS_A, a first switch signal SWS1, a second switch signal SWS2, a selection signal SEL, and a bias signal BS.

The readout circuit 120 may generate image data, based on pixel signals output from the pixel array 110. For example, the readout circuit 120 may include a correlated double sampling (CDS)/analog-digital converting (ADC) circuit, a column counter, and a decoder.

In some example embodiments, the readout circuit 120 may analog-digital convert a plurality of sensing signals received from the pixel array 110 to generate a plurality of pixel values. The plurality of sensing signals may be output voltages output from pixels PX arranged in the same row among the plurality of pixels PX of the pixel array 110 and may be referred to as pixel signals. In some example embodiments, the readout circuit 120 may perform a CDS operation on a plurality of pixel signals received thereby to remove noise.

The image signal processor 200 may include a neural network processor. The image signal processor 200 may be trained to perform an image processing operation on an input image. The image signal processor 200 may perform an image processing operation on the input image to generate an output image. In some example embodiments, the image processing operation may be an operation of generating a high-resolution image corresponding to the input image. The input image may be an image including noise, or may be a low-resolution image. The output image may be a higher-resolution image than the input image and may be an image where image quality is more improved than the input image.

The image signal processor 200 may perform image processing on an image (e.g., raw image data) output from the readout circuit 120. For example, the image signal processor 200 may perform image processing such as bad pixel correction, remosaic, or noise removal on image data IDT. The image signal processor 200 may output converted image data IDT through image processing. The converted image data IDT may be provided to an external processor 20 (for example, a main processor, an application processor, or a graphics processor of an electronic device equipped with the image sensor 100).

The external processor 20 may store the converted image data IDT, or may display an image corresponding to the converted image data IDT on a display device. The external processor 20 may perform image processing on the converted image data IDT.

Figure 3:
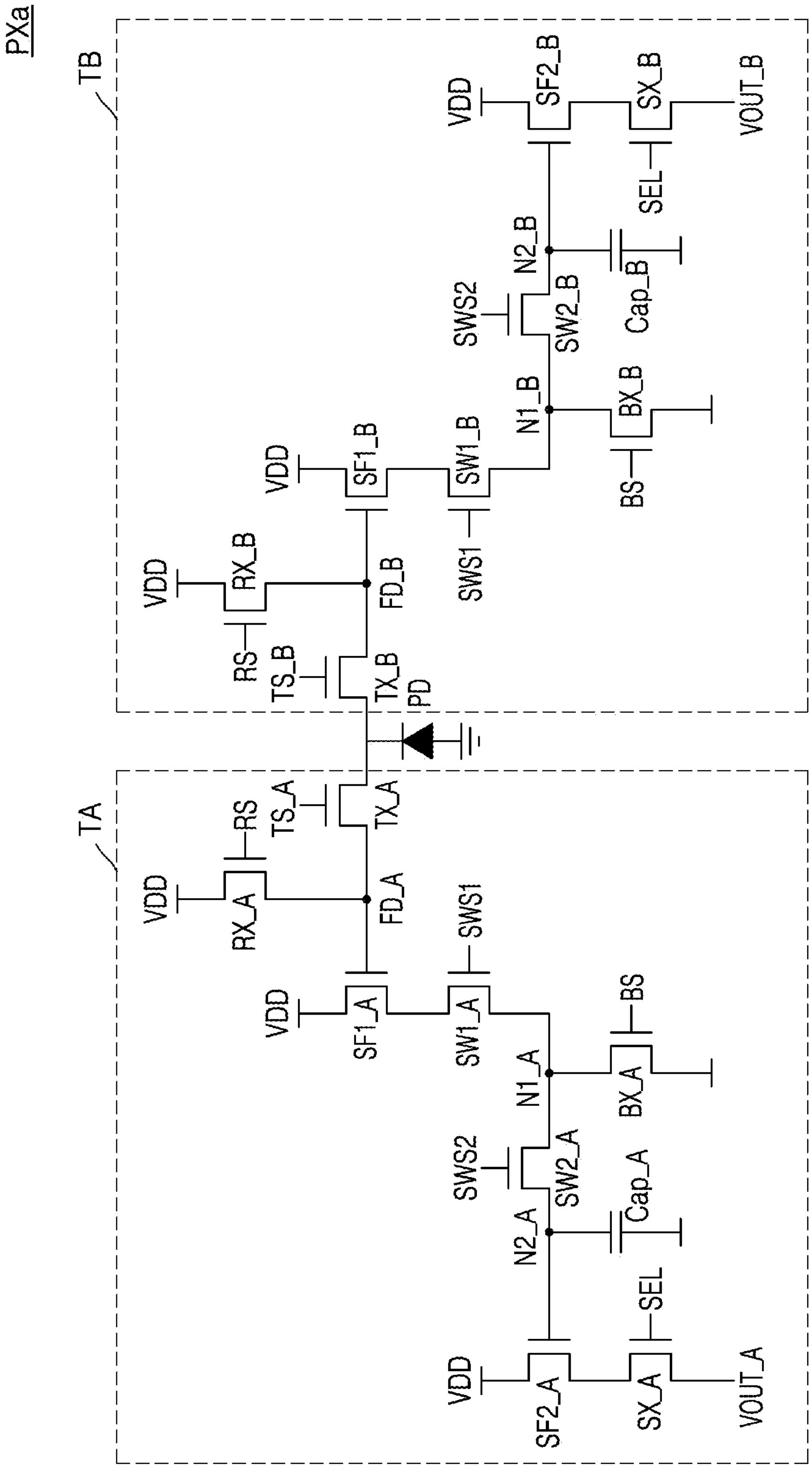
FIG. 3 is a diagram illustrating an equivalent circuit of a unit pixel according to some example embodiments.

FIG. 3 is a diagram illustrating an equivalent circuit of a unit pixel PXa according to some example embodiments. The pixel PXa of FIG. 3 may be applied as the pixel PX of FIG. 2.

Referring to FIG. 3, an equivalent circuit of the pixel PXa having a 2-tap structure is illustrated. A tap may denote a unit circuit which may distribute and transfer, at a certain ratio, photocharges generated and accumulated in a pixel by the irradiation of external light. An image sensor may implement a method which distributes and transfers, at a certain ratio, electric charges generated from an optical signal received by a pixel by using two taps.

The 2-tap structure may denote a structure where one unit pixel includes two taps, and a 4-tap structure may denote a structure where one unit pixel includes four taps. A multi-tap structure may denote a structure where one unit pixel includes two or more taps. Based on a pixel having the multi-tap structure, an optical signal may be distributed to one pixel (a unit pixel) at various ratios through one exposure operation.

The pixel PXa may include a photodiode PD, a first tap TA, and a second tap TB.

The photodiode PD may generate a photocharge which varies based on the intensity of a received optical signal. That is, the photodiode PD may convert the received optical signal into an electrical signal. The photodiode PD may be a photoelectric conversion device, and for example, may be implemented as a photo transistor, a photo gate, or a pinned photodiode (PPD).

The first tap TA may include a transfer transistor TX_A, a reset transistor RX_A, a first source follower SF1_A, a first switch SW1_A, a bias transistor BX_A, a second switch SW2_A, a capacitor Cap_A, a second source follower SF2_A, and a selection transistor SX_A.

One end of the transfer transistor TX_A may be connected to the photodiode PD, and the other end may be connected to a floating diffusion node FD_A. The transfer transistor TX_A may be turned on or off in response to a transfer gate signal TS_A. The transfer transistor TX_A may be turned on in a readout period and may transfer a photocharge, generated by the photodiode PD, to the floating diffusion node FD_A. The transfer gate signal TS_A may have an inactive level before and after an integration period, and for example, may have a low level. The transfer gate signal TS_A may be a signal which is toggled between an active level and the inactive level, in the integration period. The transfer transistor TX_A may be turned on or off in response to the transfer gate signal TS_A in the integration period. For example, hereinafter one end and another end of a corresponding transistor may be understood as respective first and second terminals of the corresponding transistor other than a gate terminal of the corresponding transistor.

The transfer transistor TX_A may be turned on in a reset period before the integration period of collecting photocharges in the pixel PX starts and may remove (or reset) photocharges accumulated in the photodiode PD. The transfer transistor TX_A may be turned on in the reset period and may be repeatedly and alternately turned on and off in the integration period, and thus, the transfer transistor TX_A may perform a global shutter function where the photodiode PD generates a photocharge in the readout period. This will be described below with reference to FIGS. 4 to 6.

The reset transistor RX_A may be connected between the floating diffusion node FD_A and a conductive line through which a supply voltage VDD is supplied. Being "connected" may denote being directly connected or being electrically connected. The reset transistor RX_A may be turned on or off in response to a reset signal RS. When the reset transistor RX_A is turned on, photocharges accumulated in the floating diffusion node FD_A may be reset. The reset transistor RX_A may be referred to as a first reset transistor.

One end of the first source follower SF1_A may be connected to the conductive line through which the supply voltage VDD is supplied, and the other end may be connected to one end of the first switch SW1_A. A gate electrode of the first source follower SF1_A may be connected to the floating diffusion node FD_A. The first source follower SF1_A may amplify and output a voltage of the floating diffusion node FD_A in response to a voltage applied to the floating diffusion node FD_A.

One end of the first switch SW1_A may be connected to the first source follower SF1_A, and the other end may be connected to a first node N1_A. The first switch SW1_A may be turned on or off in response to a first switch signal SWS1.

One end of the bias transistor BX_A may be connected to the first node N1_A. The bias transistor BX_A may be turned on or off in response to a bias signal BS.

One end of the second switch SW2_A may be connected to the first node N1_A, and the other end may be connected to a second node N2_A. The second switch SW2_A may be turned on or off in response to a second switch signal SWS2.

One end of the capacitor Cap_A may be connected to the second node N2_A, and the other end may be connected to a ground voltage. The capacitor Cap_A may receive an electric charge overflowing from the photodiode PD. The capacitor Cap_A may be referred to as a first capacitor. For example, hereinafter one end and the other end (or another end) of a capacitor may be understood as first and second terminals of the capacitor.

One end of the second source follower SF2_A may be connected to the conductive line through which the supply voltage VDD is supplied, and the other end may be connected to one end of the selection switch SX_A. A gate electrode of the second source follower SF2_A may be connected to the second node N2_A. The second source follower SF2_A may have a voltage based on an electric charge stored in the second node N2_A, and for example, the second source follower SF2_A may have a voltage based on an electric charge stored in the capacitor Cap_A. The second source follower SF2_A may amplify and output a voltage of the second node N2_A.

The selection transistor SX_A may be connected to the second source follower SF2_A. The selection transistor SX_A may be turned on in response to the selection signal SEL and may output a first pixel signal VOUT_A received from the second source follower SF2_A. The selection transistor SX_A may output the first pixel signal VOUT_A to a column wiring connected to pixels arranged in the same column. The first pixel signal VOUT_A may be transferred to a CDS/ADC circuit or a readout circuit (120 of FIG. 2) through the column wiring.

The second tap TB may include a transfer transistor TX_B, a reset transistor RX_B, a first source follower SF1_B, a first switch SW1_B, a bias transistor BX_B, a second switch SW2_B, a capacitor Cap_B, a second source follower SF2_B, and a selection transistor SX_B. A configuration and a function of the second tap TB may be similar to those of the first tap TA, and thus, their repeated descriptions are omitted.

A photocharge output from the second tap TB may be stored in the capacitor Cap_B, and the second source follower SF2_B may amplify and output a voltage of the second node N2_B. The selection transistor SX_B may be turned on in response to the selection signal SEL and may output a second pixel signal VOUT_B received from the second source follower SF2_B.

The pixel PXa may accumulate photocharges for a certain time (for example, the integration (or light collection) period) and may read out the first pixel signal VOUT_A and the second pixel signal VOUT_B each generated based on an accumulation result. For example, the first tap TA may generate the first pixel signal VOUT_A, and the second tap TB may generate the second pixel signal VOUT_B.

A transfer gate signal TS_A applied to the transfer transistor TX_A of the first tap TA and a transfer gate signal TS_B applied to the transfer transistor TX_B of the second tap TB may have a phase difference of about 180 degrees therebetween. In some example embodiments, when the transfer gate signal TS_A applied to the transfer transistor TX_A of the first tap TA has a first logic level (for example, a high level), the transfer gate signal TS_B applied to the transfer transistor TX_B of the second tap TB may have a second logic level (for example, a low level). In some example embodiments, the transfer gate signal TS_A applied to the transfer transistor TX_A of the first tap TA and the transfer gate signal TS_B applied to the transfer transistor TX_B of the second tap TB may be complementary to each other (e.g., may have complementary logic levels). Accordingly, the transfer transistor TX_A of the first tap TA and the transfer transistor TX_B of the second tap TB may be alternately turned on and off.

As described above, as the first tap TA and the second tap TB operate in response to the transfer gate signals TS_A and TS_B having different phases, the first tap TA and the second tap TB may respectively transfer and store photocharges, obtained from the photodiode PD, to and in the capacitors Cap_A and Cap_B.

In some example embodiments, because the pixel PXa has the 2-tap structure which is the multi-tap structure, the pixel PXa may support various CNN operation functions of the image signal processor. Accordingly, a delay time caused by the transfer and reception of data between the processor and the image signal processor may be reduced and/or minimized.

Figure 4:
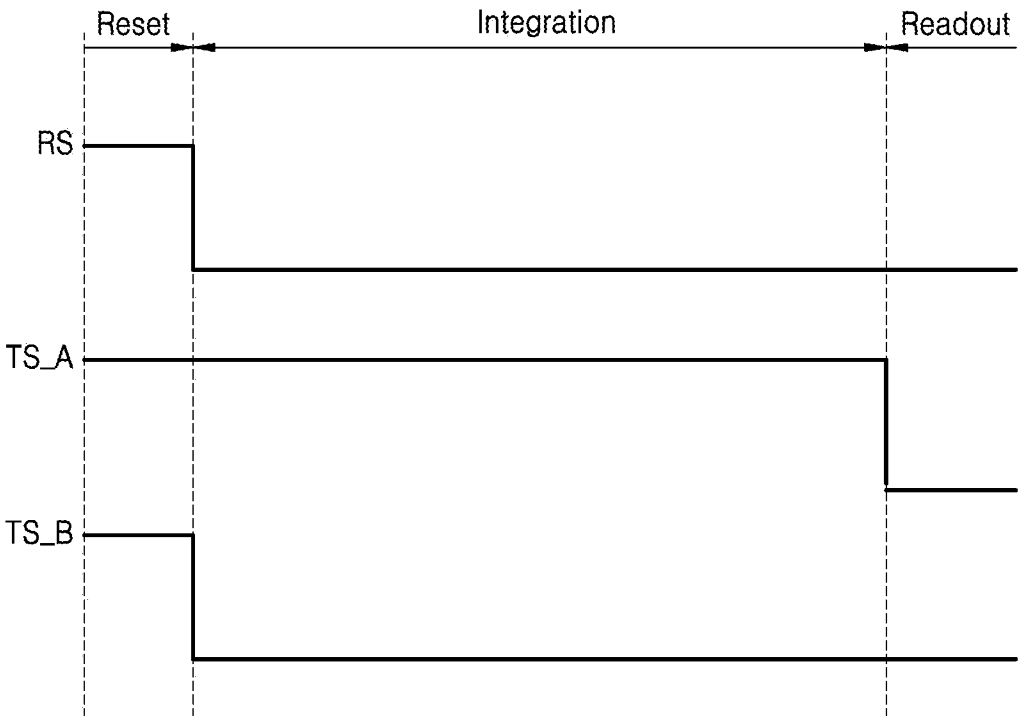
FIGS. 4, 5 and 6 are timing diagrams for describing signals input to a unit pixel according to some example embodiments.
Figure 5:
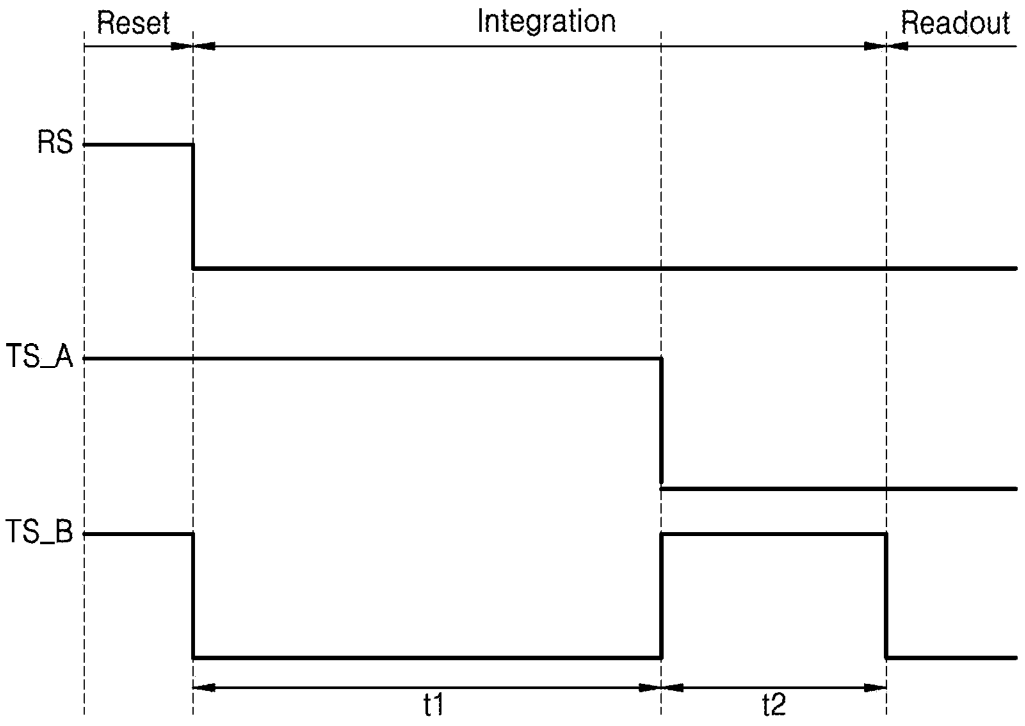
Figure 6:
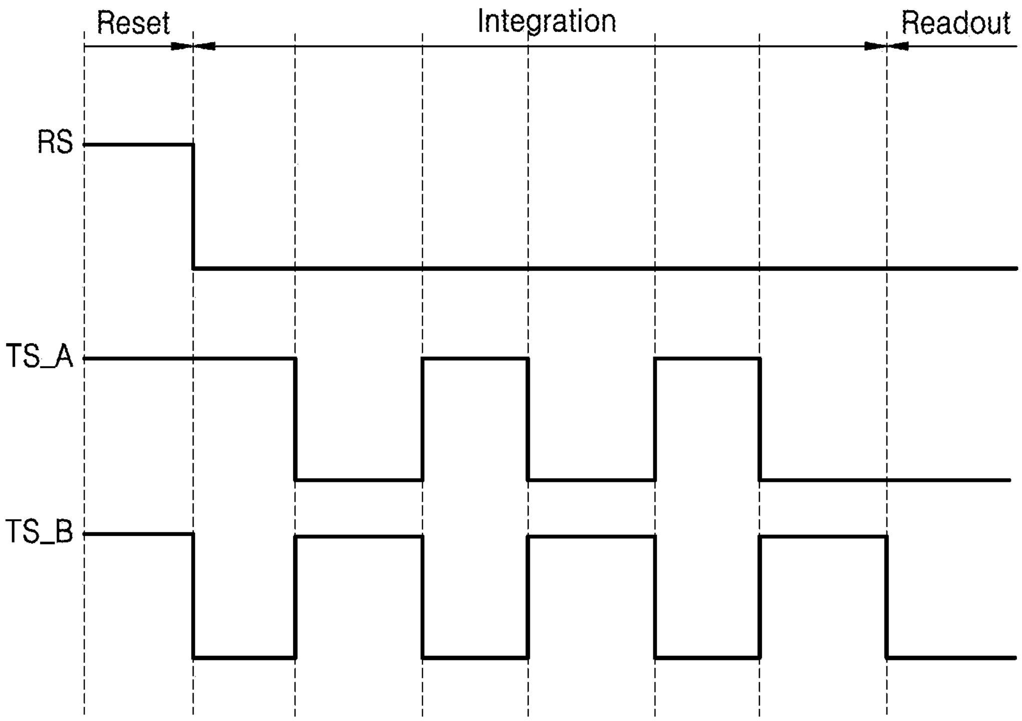

FIGS. 4 to 6 are timing diagrams describing signals applied to a unit pixel according to some example embodiments. Some example embodiments illustrated in FIGS. 4 to 6 are timing diagrams of signals applied to a unit pixel which operates based on a global shutter scheme.

For example, FIG. 4 is a timing diagram of a method which controls only a first tap transfer gate signal, FIG. 5 is a timing diagram of a method which controls a turn-on/off rate of each of the first tap transfer gate signal and a second tap transfer gate signal, and FIG. 6 is a timing diagram of a method which controls the first tap transfer gate signal and the second tap transfer gate signal, based on a toggling scheme.

First, referring to FIG. 4, the global shutter scheme may include a global reset period Reset, an integration period Integration, and a readout period Readout.

In the global reset period Reset, a reset signal RS, a first tap transfer gate signal TS_A, and a second tap transfer gate signal TS_B may have a turn-on level (for example, a logic high level).

In the integration period Integration, the reset signal RS and the second tap transfer gate signal TS_B may have a turn-off level (for example, a logic low level). The first tap transfer gate signal TS_A may maintain the turn-on level. In some example embodiments, a phase difference between the first tap transfer gate signal TS_A and the second tap transfer gate signal TS_B may be about 180 degrees. The first tap transfer gate signal TS_A and the second tap transfer gate signal TS_B may be complementary to each other.

In the readout period Readout, the reset signal RS and the second tap transfer gate signal TS_B may maintain the turn-off level. The first tap transfer gate signal TS_A may be shifted to the turn-off level.

As described above, in the integration period Integration, a first tap and a second tap may operate in response to the first tap transfer gate signal TS_A and the second tap transfer gate signal TS_B having different phases and may thus classify and transfer a photocharge, obtained from the photodiode PD, to a capacitor Cap_A of the first tap.

Referring to FIG. 5, the pixel PXa illustrated in FIG. 3 may operate based on timings of signals illustrated in FIG. 5.

In a global reset period Reset, an operating method of each of a reset signal RS, a first tap transfer gate signal TS_A, and a second tap transfer gate signal TS_B may be the same as the above descriptions of FIG. 4.

In an integration period Integration, the reset signal RS, the first tap transfer gate signal TS_A, and the second tap transfer gate signal TS_B may divisionally operate in a first period t1 and a second period t2, unlike the above descriptions of FIG. 4.

In the first period t1, the reset signal RS and the second tap transfer gate signal TS_B may be shifted to a turn-off level, and the first tap transfer gate signal TS_A may maintain a turn-on level.

In the second period t2, the reset signal RS may maintain the turn-off level, the first tap transfer gate signal TS_A may be shifted to the turn-off level, and the second tap transfer gate signal TS_B may be shifted to the turn-on level.

As illustrated in FIG. 5, the first period t1 may be longer than the second period t2, but some example embodiments are not limited thereto and the first period t1 may be equal to the second period t2 and the first period t1 may be shorter than the second period t2.

In the readout period Readout, the reset signal RS and the first tap transfer gate signal TS_A may maintain the turn-off level. The second tap transfer gate signal TS_B may be shifted to the turn-off level.

As described above, in the integration period Integration, a first tap and a second tap may operate in response to the first tap transfer gate signal TS_A and the second tap transfer gate signal TS_B having different phases, and thus, the first tap and the second tap may classify and transfer photocharges, obtained from the photodiode PD, to a capacitor Cap_A of the first tap and a capacitor Cap_B of the second tap.

Referring to FIG. 6, the pixel PXa illustrated in FIG. 3 may operate based on timings of signals illustrated in FIG. 6.

In a global reset period Reset, an operating method of each of a reset signal RS, a first tap transfer gate signal TS_A, and a second tap transfer gate signal TS_B may be the same as the above descriptions of FIG. 4.

In an integration period Integration, the reset signal RS may be shifted to a turn-off level, and the first tap transfer gate signal TS_A and the second tap transfer gate signal TS_B may be respectively toggled to a turn-on level and the turn-off level. For example, each of the first tap transfer gate signal TS_A and the second tap transfer gate signal TS_B may be a modulation signal which is toggled between an active level and an inactive level in the integration period Integration. A phase difference between the first tap transfer gate signal TS_A and the second tap transfer gate signal TS_B may be about 180 degrees.

Referring to FIGS. 3 and 6, the first tap transfer transistor TX_A may be repeatedly and alternately turned on and off in the integration period Integration in response to the first tap transfer gate signal TS_A that may be provided by a controller within the image sensor 100. The first tap transistor TX_A may thus provide a photocharge, generated from the photodiode PD, to the first tap capacitor Cap_A. The second tap transfer transistor TX_B may be repeatedly and alternately turned on and off in the integration period Integration in response to the second tap transfer gate signal TS_B that may be provided by the controller within the image sensor. The second tap transistor TX_B may provide a photocharge, generated from the photodiode PD, to the second tap capacitor Cap_B. For example, during the integration period Integration, the controller may control an on/off ratio of the transfer gate signal TS_A and/or the transfer gate signal TS_B, to control output voltages of first tap TA and/or second tap TB. According to some example embodiments, the performance of a global shutter operation may be enhanced.

Figure 7:
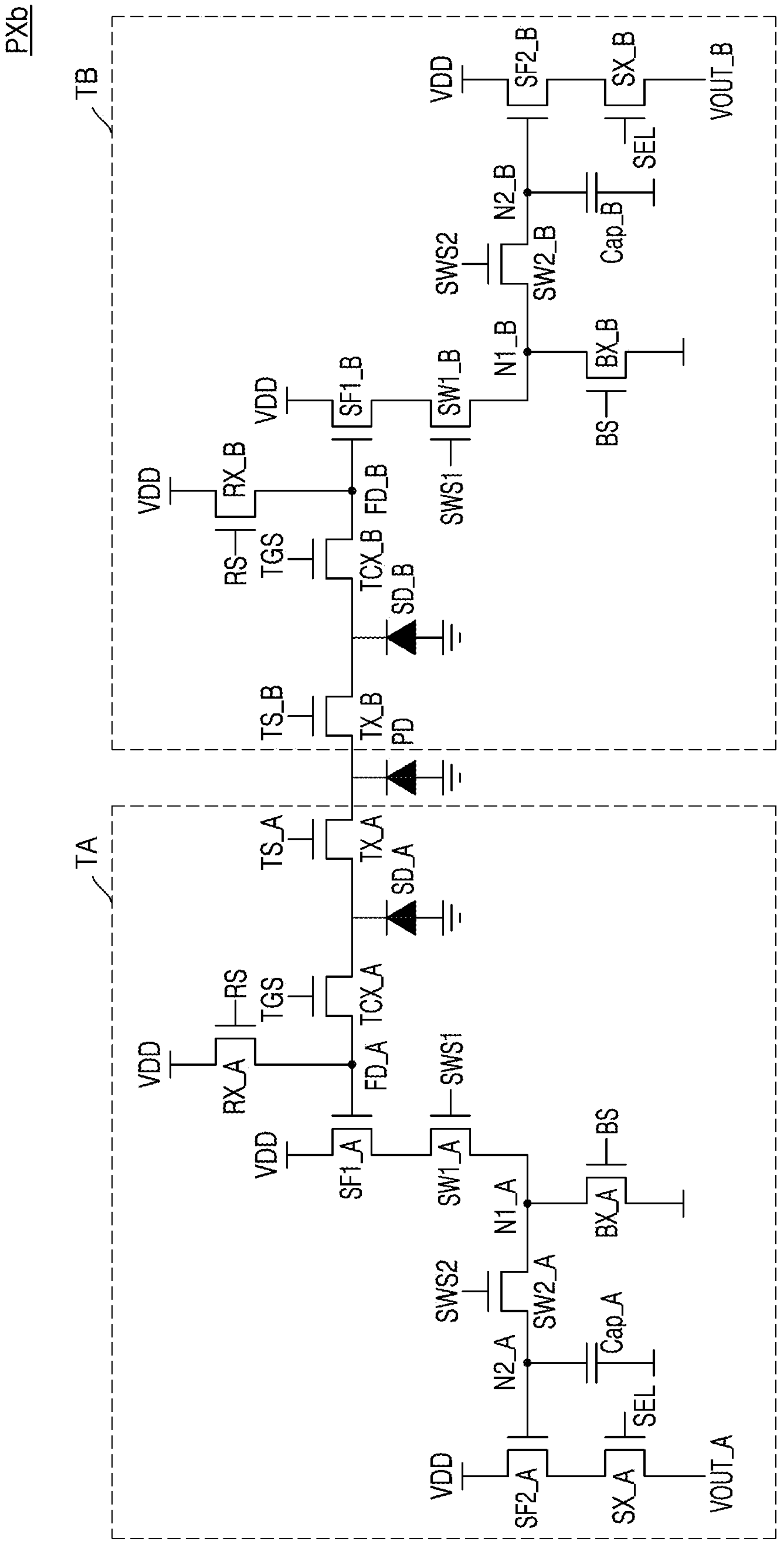
FIGS. 7, 8, 9, 10, 11, 12 and 13 are diagrams illustrating equivalent circuits of a unit pixel according to some example embodiments.

FIG. 7 is a diagram illustrating an equivalent circuit of a unit pixel PXb according to some example embodiments. The pixel PXb of FIG. 7 may be applied as the pixel PX of FIG. 2 and may be a modification example of the pixel PXa of FIG. 3, and thus differences therebetween will be mainly described below.

Referring to FIG. 7, a first tap TA may further include a storage diode SD_A and a transfer control transistor TCX_A.

The storage diode SD_A may be connected between a transfer transistor TX_A and the transfer control transistor TCX_A. The storage diode SD_A may temporarily accumulate photocharges accumulated in a photodiode PD through the transfer transistor TX_A.

The transfer control transistor TCX_A may be connected between the storage diode SD_A and a floating diffusion node FD_A. The transfer control transistor TCX_A may be turned on or off in response to a transfer gate signal TGS. The transfer control transistor TCX_A may be turned on and may transfer a photocharge, stored in the storage diode SD_A, to the floating diffusion node FD_A.

A second tap TB may further include a storage diode SD_B and a transfer control transistor TCX_B. A configuration and a function of the second tap TB may be similar to those of the first tap TA, and thus, their repeated descriptions are omitted.

Figure 8:
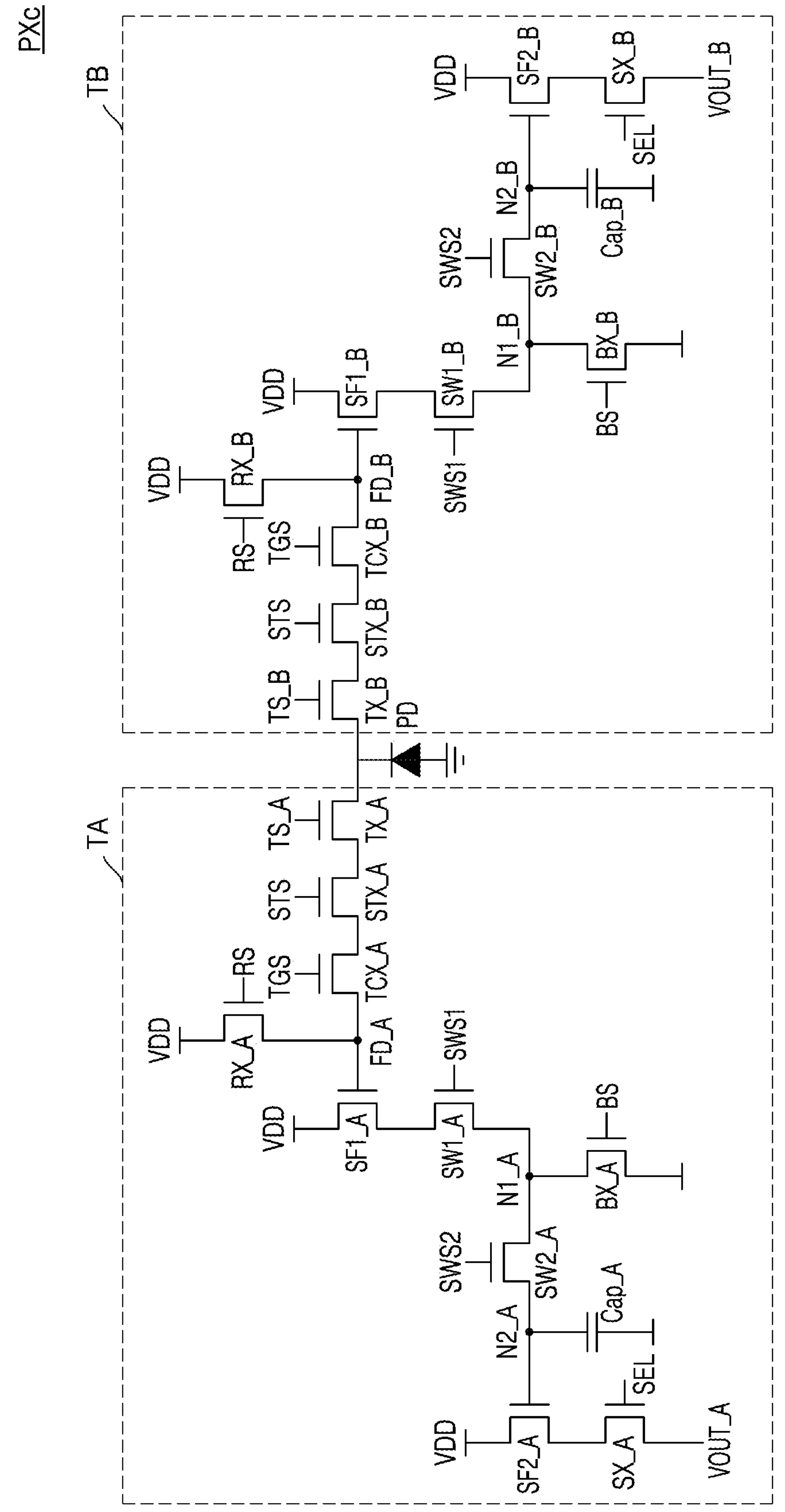

FIG. 8 is a diagram illustrating an equivalent circuit of a unit pixel PXc according to some example embodiments. The pixel PXc of FIG. 8 may be applied as the pixel PX of FIG. 2 and may be a modification example of the pixel PXb of FIG. 7, and thus differences therebetween will be mainly described below.

The storage diode SD_A of FIG. 7 may be replaced with a storage transistor STX_A of FIG. 8. The storage transistor STX_A may be connected between a transfer transistor TX_A and a transfer control transistor TCX_A. The storage transistor STX_A may be turned on or off in response to a storage control signal STS. The storage transistor STX_A may temporarily accumulate photocharges, received from the photodiode PD, through the transfer transistor TX_A in response to the storage control signal STS. The storage transistor STX_A may be turned on and may accumulate photocharges in an integration period and a readout period.

A second tap TB may further include a storage transistor STX_B connected between a transfer transistor TX_B and a transfer control transistor TCX_B. A configuration and function of the transfer transistor TX_B and the transfer control transistor TCX_B may be similar to those of the transfer transistor TX_A and the transfer control transistor TCX_A, and thus, their repeated descriptions are omitted.

Figure 9:
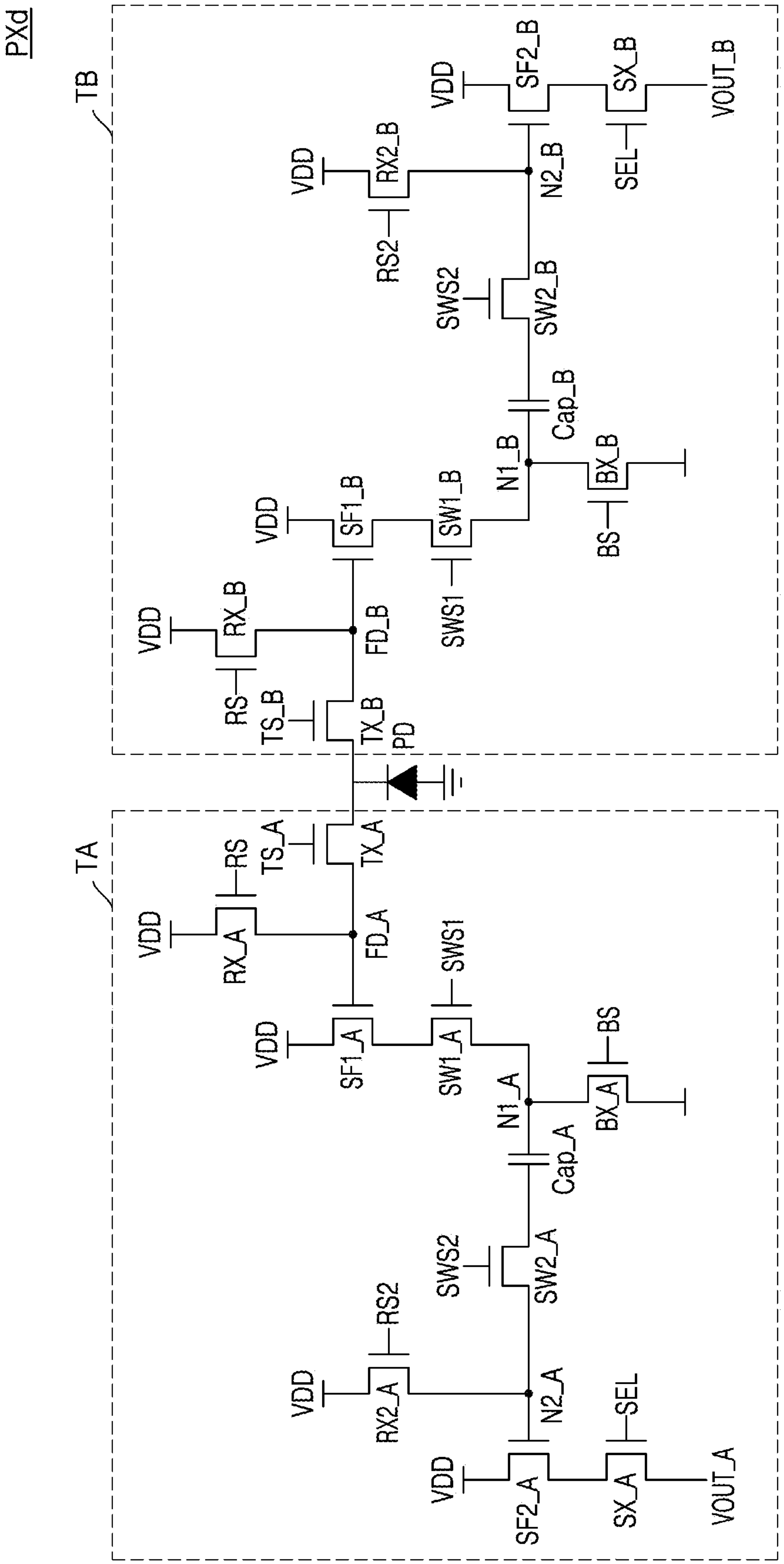

FIG. 9 is a diagram illustrating an equivalent circuit of a unit pixel PXd according to some example embodiments. The pixel PXd of FIG. 9 may be applied as the pixel PX of FIG. 2 and may be a modification example of the pixel PXa of FIG. 3, and thus, differences therebetween will be mainly described below.

Referring to FIG. 9, a first tap TA may further include a second reset transistor RX2_A.

One end of a capacitor Cap_A may be connected to a first node N1_A, and the other end may be connected to a second switch SW2_A. One end of the second switch SW2_A may be connected to the capacitor Cap_A, and the other end may be connected to a second node N2_A. The capacitor Cap_A and the second switch SW2_A may be serially connected to each other.

One end of a second reset transistor RX2_A may be connected to a conductive line through which a supply voltage VDD is supplied, and the other end may be connected to the second node N2_A. The second reset transistor RX2_A may be turned on or off in response to a second reset signal RS2.

A second tap TB may further include a second reset transistor RX2_B. A configuration and function of the second tap TB may be similar to those of the first tap TA, and thus, their repeated descriptions are omitted.

Figure 10:
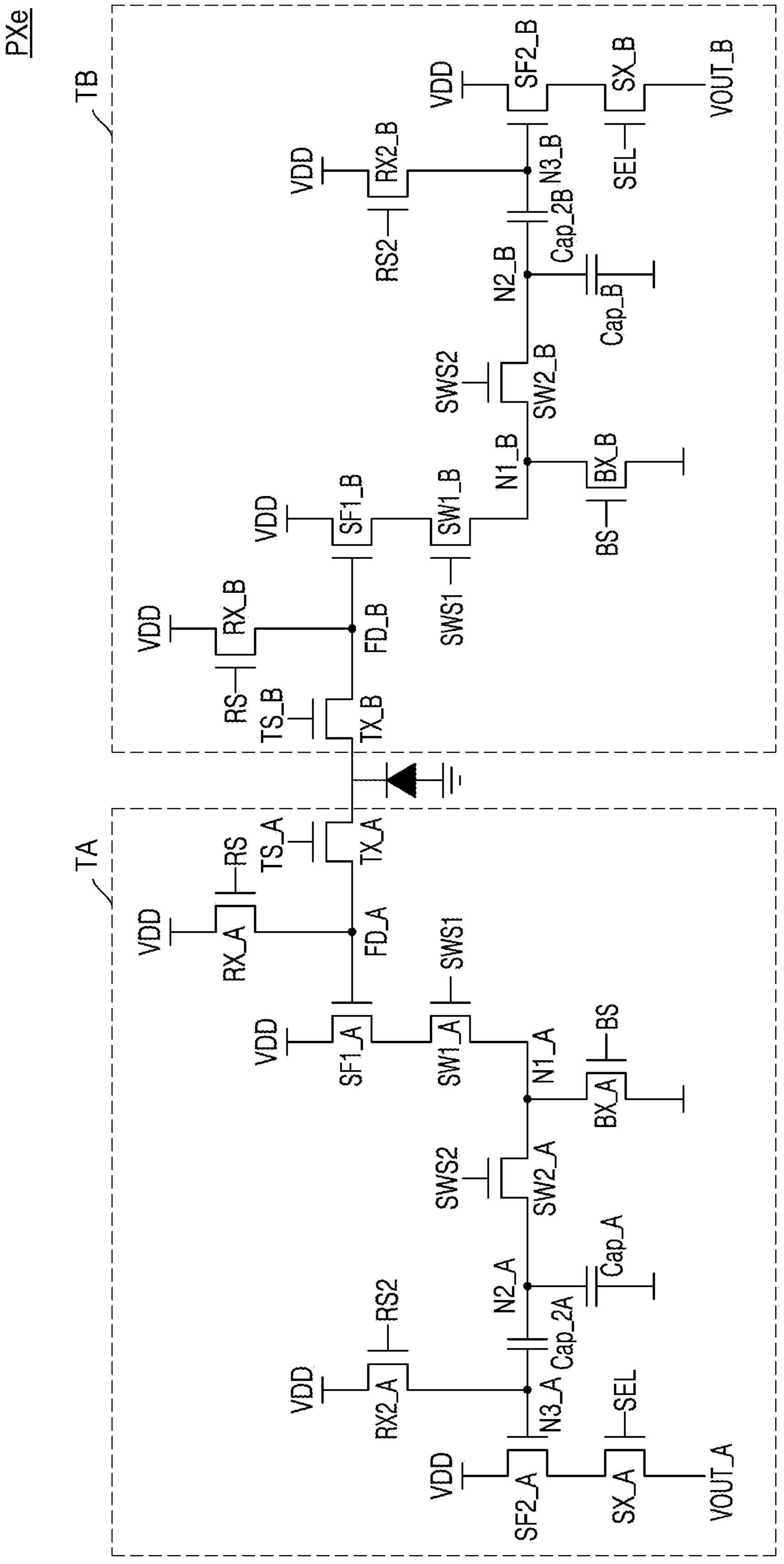

FIG. 10 is a diagram illustrating an equivalent circuit of a unit pixel PXe according to some example embodiments. The pixel PXe of FIG. 10 may be applied as the pixel PX of FIG. 2 and may be a modification example of the pixel PXd of FIG. 9, and thus differences therebetween will be mainly described below.

Referring to FIG. 10, a first tap TA may further include a second capacitor Cap2_A and a second reset transistor RX2_A.

The second capacitor Cap2_A may be connected between a second node N2_A and a third node N3_A. In some example embodiments, the second capacitor Cap2_A may be a parasitic capacitor. One end of a second reset transistor RX2_A may be connected to a conductive line through which a supply voltage VDD is supplied, and the other end may be connected to the third node N3_A.

A gate electrode of a second source follower SF2_A may be connected to the third node N3_A. The second source follower SF2_A may have a voltage based on an electric charge stored in a capacitor Cap_A and/or the second capacitor Cap2_A, and the second source follower SF2_A may amplify and output a voltage of the third node N3_A.

A second tap TB may further include a second capacitor Cap2_B and a second reset transistor RX2_B. A configuration and a function of the second tap TB may be similar to those of the first tap TA, and thus, their repeated descriptions are omitted.

Figure 11:
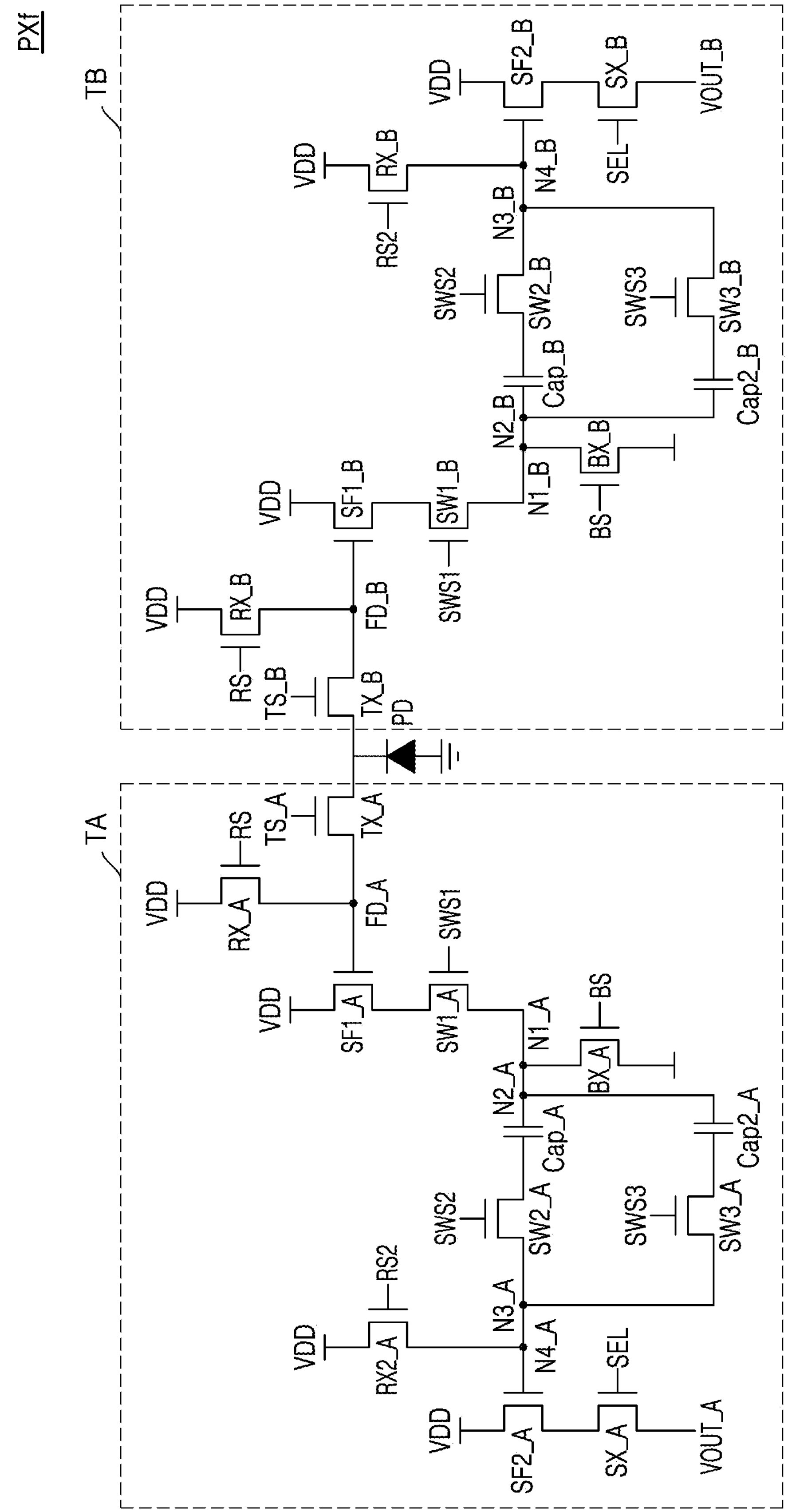

FIG. 11 is a diagram illustrating an equivalent circuit of a unit pixel PXf according to some example embodiments. The pixel PXf of FIG. 11 may be applied as the pixel PX of FIG. 2 and may be a modification example of the pixel PXa of FIG. 3, and thus differences therebetween will be mainly described below.

Referring to FIG. 11, a first tap TA may further include a third switch SW3_A and a second capacitor Cap2_A.

A first capacitor Cap_A may be connected between a second node N2_A and a second switch SW2_A. The first capacitor Cap_A may accumulate a reset charge generated from a photodiode PD.

The second switch SW2_A may be connected between the first capacitor Cap_A and the third node N3_A. The second switch SW2_A may be turned on or off in response to a second switch signal SWS2.

A second capacitor Cap2_A may be connected between the second node N2_A and the third switch SW3_A. The second capacitor Cap2_A may accumulate an image charge generated from the photodiode PD.

The third switch SW3_A may be connected between the second capacitor Cap2_A and the third node N3_A. The third switch SW3_A may be turned on or off in response to a third switch signal SWS3.

One end of a second reset transistor RX2_A may be connected to a conductive line through which a supply voltage VDD is supplied, and the other end may be connected to a fourth node N4_A. The second reset transistor RX2_A may be turned on or off in response to a second reset signal RS2.

A gate electrode of a second source follower SF2_A may be connected to the fourth node N4_A. The second source follower SF2_A may have a voltage based on an electric charge stored in a first capacitor Cap_A and/or the second capacitor Cap2_A. The second source follower SF2_A may amplify and output a voltage of the fourth node N4_A.

In some example embodiments, an electric charge accumulated in the first capacitor Cap_A may be a reset charge, and an electric charge accumulated in the second capacitor Cap2_A may be an image charge, but some other example embodiments are not limited thereto. According to some example embodiments, the kind of electric charge accumulated in each of the first capacitor Cap_A and the second capacitor Cap2_A may be different. For example, the electric charge accumulated in the first capacitor Cap_A may be the image charge, and the electric charge accumulated in the second capacitor Cap2_A may be the reset charge.

A second tap TB may further include a third switch SW3_B and a second capacitor Cap2_B. A configuration and a function of the second tap TB may be similar to those of the first tap TA, and thus, their repeated descriptions are omitted.

Figure 12:
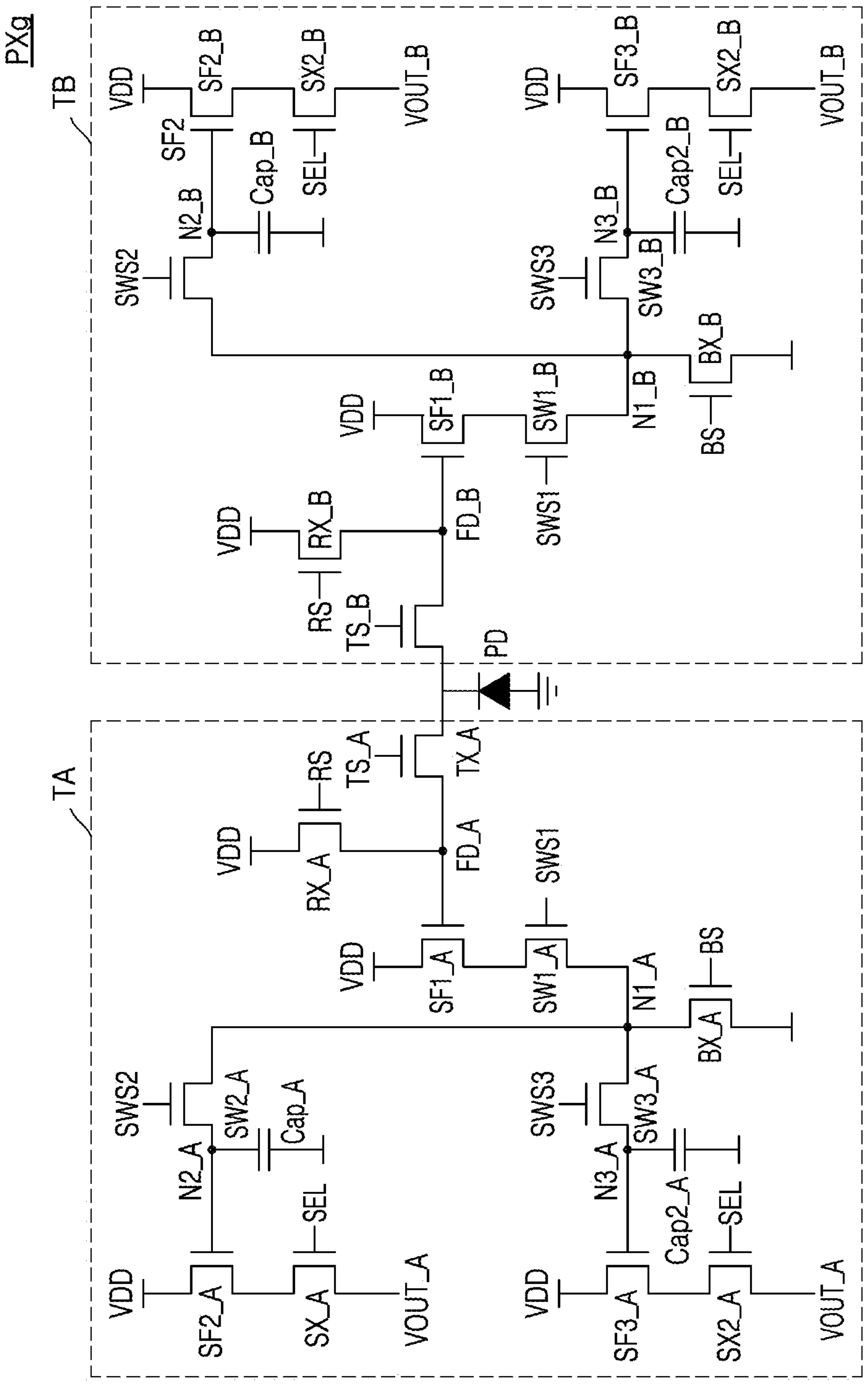

FIG. 12 is a diagram illustrating an equivalent circuit of a unit pixel PXg according to some example embodiments. The pixel PXg of FIG. 12 may be applied as the pixel PX of FIG. 2 and may be a modification example of the pixel PXa of FIG. 3, and thus differences therebetween will be mainly described below.

Referring to FIG. 12, a first tap TA may further include a third switch SW3_A, a second capacitor Cap2_A, a third source follower SF3_A, and a second selection transistor SX2_A.

A first capacitor Cap_A may be connected to a second node N2_A and may accumulate a reset charge generated from a photodiode PD.

The second switch SW2_A may be connected between a first node N1_A and the second node N2_A. The second switch SW2_A may be turned on or off in response to a second switch signal SWS2.

The second capacitor Cap2_A may be connected to a third node N3_A and may accumulate an image charge generated from the photodiode PD.

The third switch SW3_A may be connected between the first node N1_A and the third node N3_A. The third switch SW3_A may be turned on or off in response to a third switch signal SWS3.

A gate electrode of the second source follower SF2_A may be connected to the second node N2_A. The second source follower SF2_A may have a voltage based on an electric charge accumulated in the first capacitor Cap_A. The second source follower SF2_A may amplify and output a voltage of the second node N2_A.

The selection transistor SX_A may be connected to the second source follower SF2_A and may be turned on or off in response to a selection signal SEL.

A gate electrode of the third source follower SF3_A may be connected to the third node N3_A. The third source follower SF3_A may have a voltage based on an electric charge accumulated in the second capacitor Cap2_A. The third source follower SF3_A may amplify and output a voltage of the third node N3_A.

The third selection transistor SX3_A may be connected to the third source follower SF3_A and may be turned on or off in response to the selection signal SEL.

In some example embodiments, an electric charge accumulated in the first capacitor Cap_A may be a reset charge, and an electric charge accumulated in the second capacitor Cap2_A may be an image charge, but some other example embodiments are not limited thereto. According to some example embodiments, the kind of electric charge accumulated in each of the first capacitor Cap_A and the second capacitor Cap2_A may be different. For example, the electric charge accumulated in the first capacitor Cap_A may be the image charge, and the electric charge accumulated in the second capacitor Cap2_A may be the reset charge.

A second tap TB may further include a third switch SW3_B, a second capacitor Cap2_B, a third source follower SF3_B, and a second selection transistor SX2_B. A configuration and a function of the second tap TB may be similar to those of the first tap TA, and thus, their repeated descriptions are omitted.

Figure 13:
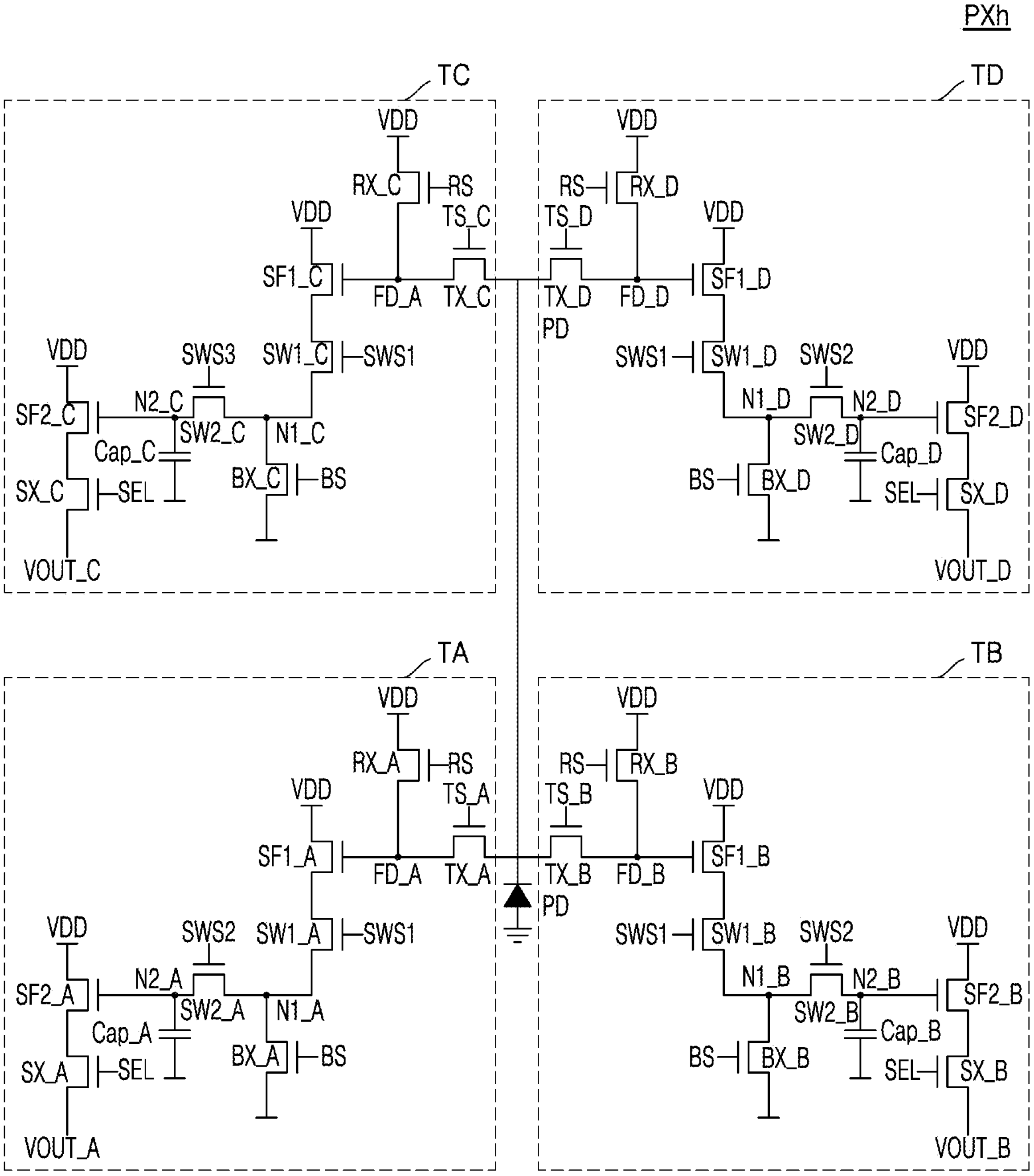

FIG. 13 is a diagram illustrating an equivalent circuit of a unit pixel PXh according to some example embodiments. The pixel PXh of FIG. 13 may be applied as the pixel PX of FIG. 2.

Referring to FIG. 13, an equivalent circuit of the pixel PXh having a 4-tap structure is illustrated. The 4-tap structure may denote a structure where one unit pixel includes four taps. An image sensor may implement a method which classifies and transfers, by phases, electric charges generated from an optical signal received by a pixel by using four taps. Based on a pixel having the 4-tap structure, a size of a pixel array may be reduced and/or minimized, and thus, the degree of integration of image sensors may be enhanced.

The pixel PXh of FIG. 13 may be a modification example of the pixel PXa of FIG. 3, and thus differences therebetween will be mainly described below.

Referring to FIG. 13, the pixel PXh may include a photodiode PD, a first tap TA, a second tap TB, a third tap TC, and a fourth tap TD.

The first tap TA may include a transfer transistor TX_A, a reset transistor RX_A, a first source follower SF1_A, a first switch SW1_A, a bias transistor BX_A, a second switch SW2_A, a capacitor Cap_A, a second source follower SF2_A, and a selection transistor SX_A.

The second tap TB may include a transfer transistor TX_B, a reset transistor RX_B, a first source follower SF1_B, a first switch SW1_B, a bias transistor BX_B, a second switch SW2_B, a capacitor Cap_B, a second source follower SF2_B, and a selection transistor SX_B.

The third tap TC may include a transfer transistor TX_C, a reset transistor RX_C, a first source follower SF1_C, a first switch SW1_C, a bias transistor BX_C, a second switch SW2_C, a capacitor Cap_C, a second source follower SF2_C, and a selection transistor SX_C.

The fourth tap TD may include a transfer transistor TX_D, a reset transistor RX_D, a first source follower SF1_D, a first switch SW1_D, a bias transistor BX_D, a second switch SW2_D, a capacitor Cap_D, a second source follower SF2_D, and a selection transistor SX_D.

A configuration and a function of each of the second to fourth taps TB, TC, and TD may be similar to those of the first tap TA as described with respect to FIG. 3, and thus, their repeated descriptions are omitted.

A photocharge output from the third tap TC may be stored in the capacitor Cap_C, and the second source follower SF2_C may amplify and output a voltage of the second node N2_C. The selection transistor SX_C may be turned on in response to the selection signal SEL and may output a third pixel signal VOUT_C received from the second source follower SF2_C.

A photocharge output from the fourth tap TD may be stored in the capacitor Cap_D, and the second source follower SF2_D may amplify and output a voltage of the second node N2_D. The selection transistor SX_D may be turned on in response to the selection signal SEL and may output a fourth pixel signal VOUT_D received from the second source follower SF2_D.

A transfer gate signal TS_C applied to the transfer transistor TX_C of the third tap TC and a transfer gate signal TS_D applied to the transfer transistor TX_D of the fourth tap TD may have a phase difference of about 180 degrees therebetween. In some example embodiments, each of a first tap TA transfer gate signal TS_A, a second tap TB transfer gate signal TS_B, a third tap TC transfer gate signal TS_C, and a fourth tap TD transfer gate signal TS_D may have a phase difference of about 90 degrees therebetween. As described above, the first tap TA, the second tap TB, the third tap TC, and the fourth tap TD may operate in response to the transfer gate signals TS_A, TS_B, TS_C, and TS_D having different phases.

The pixel PXh having the 4-tap circuit structure has been described above with reference to FIG. 13. However, some example embodiments of the inventive concepts are not limited thereto, and a pixel applied to a pixel array (110 of FIG. 2) may have an N-tap circuit structure (where N may be an integer of 2 or more). Transfer gate signals provided to N number of taps may have a phase difference of about 360 degrees/N.

In some example embodiments, because the pixel PXh has the 4-tap structure which is the multi-tap structure, the pixel PXa may support various CNN operation functions of the image signal processor. Accordingly, a delay time caused by the transfer and reception of data between the processor and the image signal processor may be reduced and/or minimized.

Figure 14:
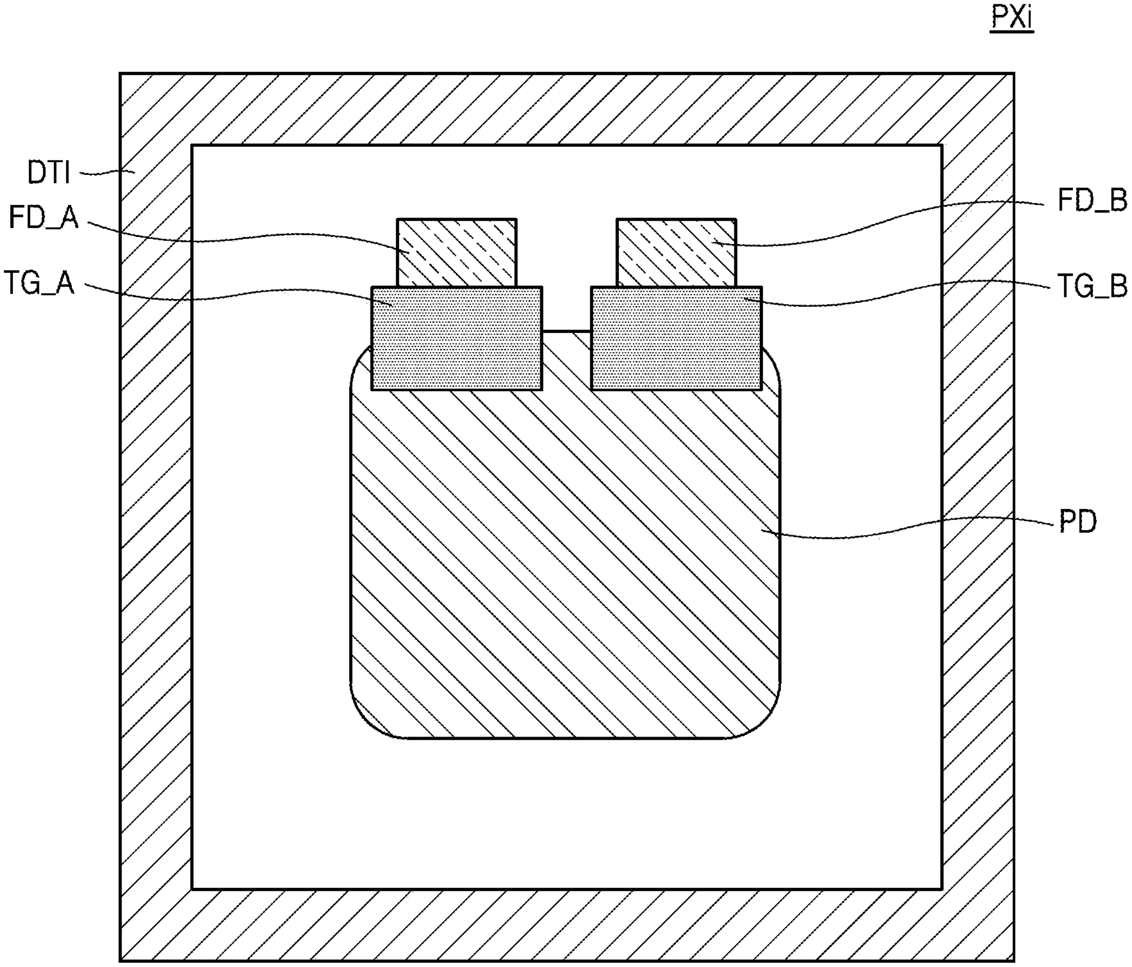
FIGS. 14 and 15 are layouts of a unit pixel according to some example embodiments.
Figure 15:
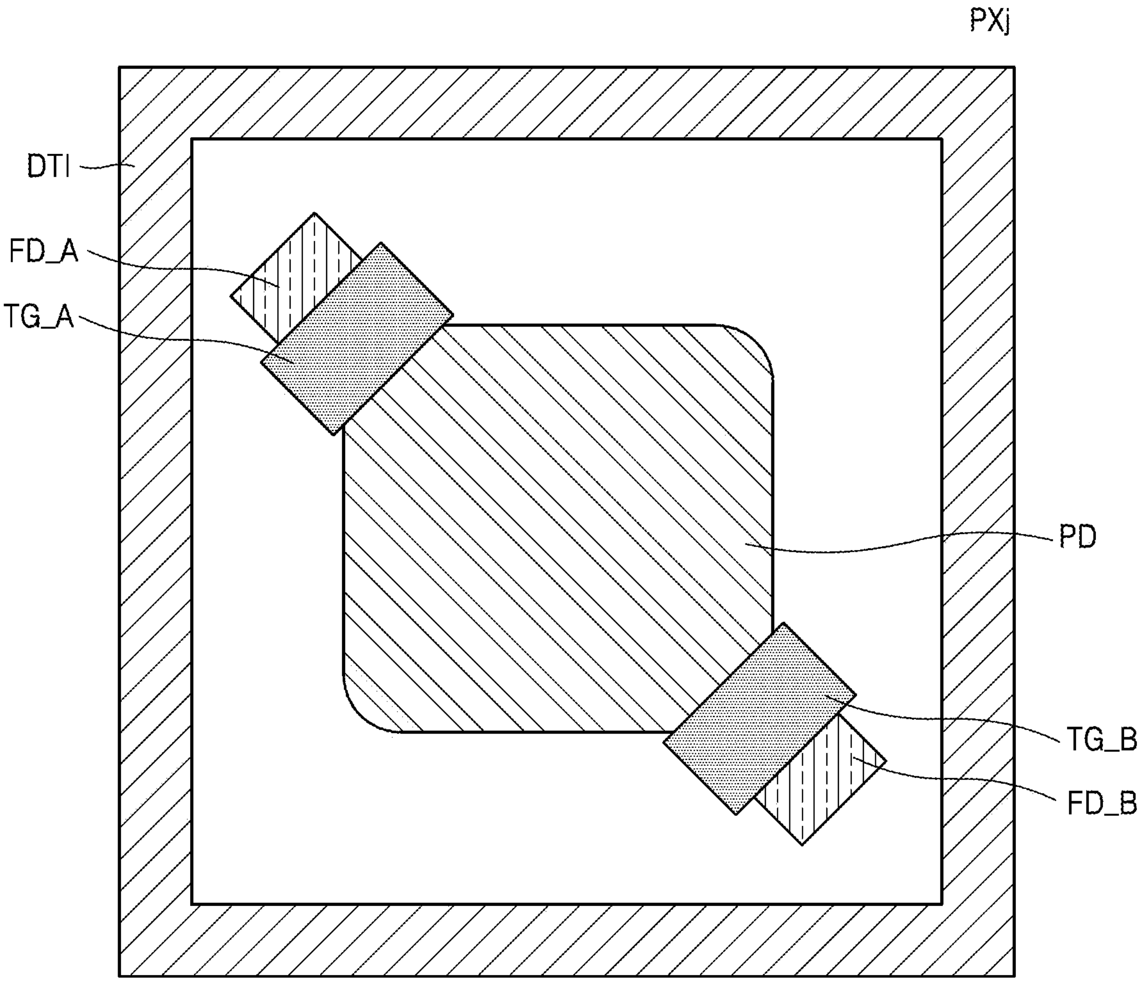

FIGS. 14 and 15 are layouts of unit pixels PXi and PXj according to some example embodiments. FIGS. 14 and 15 are diagrams illustrating pixels PXi and PXj having a 2-tap structure.

Referring to FIGS. 14 and 15, a deep trench insulator (DTI) structure DTI may divide a pixel region in a two-dimensional (2D) plane. A photodiode PD, first and second transfer gates TG_A and TG_B, and first and second floating diffusion nodes FD_A and FD_B may be formed in the pixel region. The first transfer gate TG_A may be a gate of a transfer transistor TX_A of a first tap, and the second transfer gate TG_B may be a gate of a transfer transistor TX_B of a second tap (e.g., see FIG. 3). The first floating diffusion node FD_A may be a first tap floating diffusion node FD_A, and the second floating diffusion node FD_B may be a second tap floating diffusion node FD_B.

The first transfer gate TG_A and the first floating diffusion node FD_A may configure a first tap TA, and the second transfer gate TG_B and the second floating diffusion node FD_B may configure a second tap TB. The first transfer gate TG_A and the second transfer gate TG_B may be formed on the photodiode PD. The first transfer gate TG_A and the second transfer gate TG_B may be respectively connected to the first floating diffusion node FD_A and the second floating diffusion node FD_B.

The DTI structure DTI may be disposed on an outer surface of a semiconductor substrate or between a plurality of pixels and may include, for example, an insulating material including oxide, nitride, or a combination thereof. In some example embodiments, the DTI structure DTI may include a conductive material layer and a cover insulation layer surrounding the conductive material layer. For example, the conductive material layer may include polysilicon, metal, metal nitride, or oxide such as silicon oxide ($SiO_2$).

Referring to FIG. 14, the first transfer gate TG_A and the second transfer gate TG_B may be formed at a same position of the photodiode PD (e.g., at a first side of the photodiode PD adjacent to each other). In some example embodiments, in the pixel region, the first tap may be disposed in a left region of the photodiode PD, and the second tap may be disposed in a right region of the photodiode PD.

Referring to FIG. 15, the first transfer gate TG_A and the second transfer gate TG_B may be formed to be symmetric with each other. For example, the first transfer gate TG_A may be formed at a first corner portion of the photodiode PD, and the second transfer gate TG_B may be formed at a second corner portion of the photodiode PD that is located diagonally with respect to the first corner portion. As described above, each of the pixels may have a phase symmetric structure of a 2-tap circuit.

Also, in some example embodiments, referring to FIGS. 14 and 15, the photodiode PD, the transfer transistor TX_A, and the first floating diffusion node FD_A of a pixel PX may be disposed in an upper portion of the pixel structure in a vertical direction, and the other elements of the pixel PX may be disposed in a lower portion of the pixel structure in the vertical direction.

Figure 16:
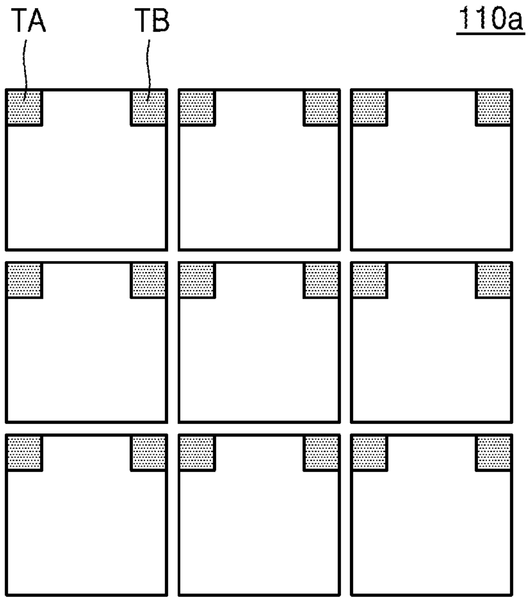
FIG. 16 is a diagram illustrating a layout of a pixel array according to some example embodiments.

FIG. 16 is a diagram illustrating a layout of a pixel array 110*a* according to some example embodiments.

Referring to FIG. 16, in the pixel array 110*a*, each of a plurality of pixels may include a first tap TA and a second tap TB. A layout pattern of each of the plurality of pixels may have a tetragonal pattern. For example, the plurality of pixels may be divided by a DTI structure including a metal material, and a shape of a grid represented by the DTI structure at a backside may have a tetragonal pattern.

In the plurality of pixels of the pixel array 110*a*, the first taps TA may be disposed at a same relative position in the pixels, and the second taps TB may also be disposed at a same relative position in the pixels. For example, the first taps TA may be disposed in a left portion of the pixels, and the second taps TB may be disposed in a right portion of the pixels.

Figure 17:
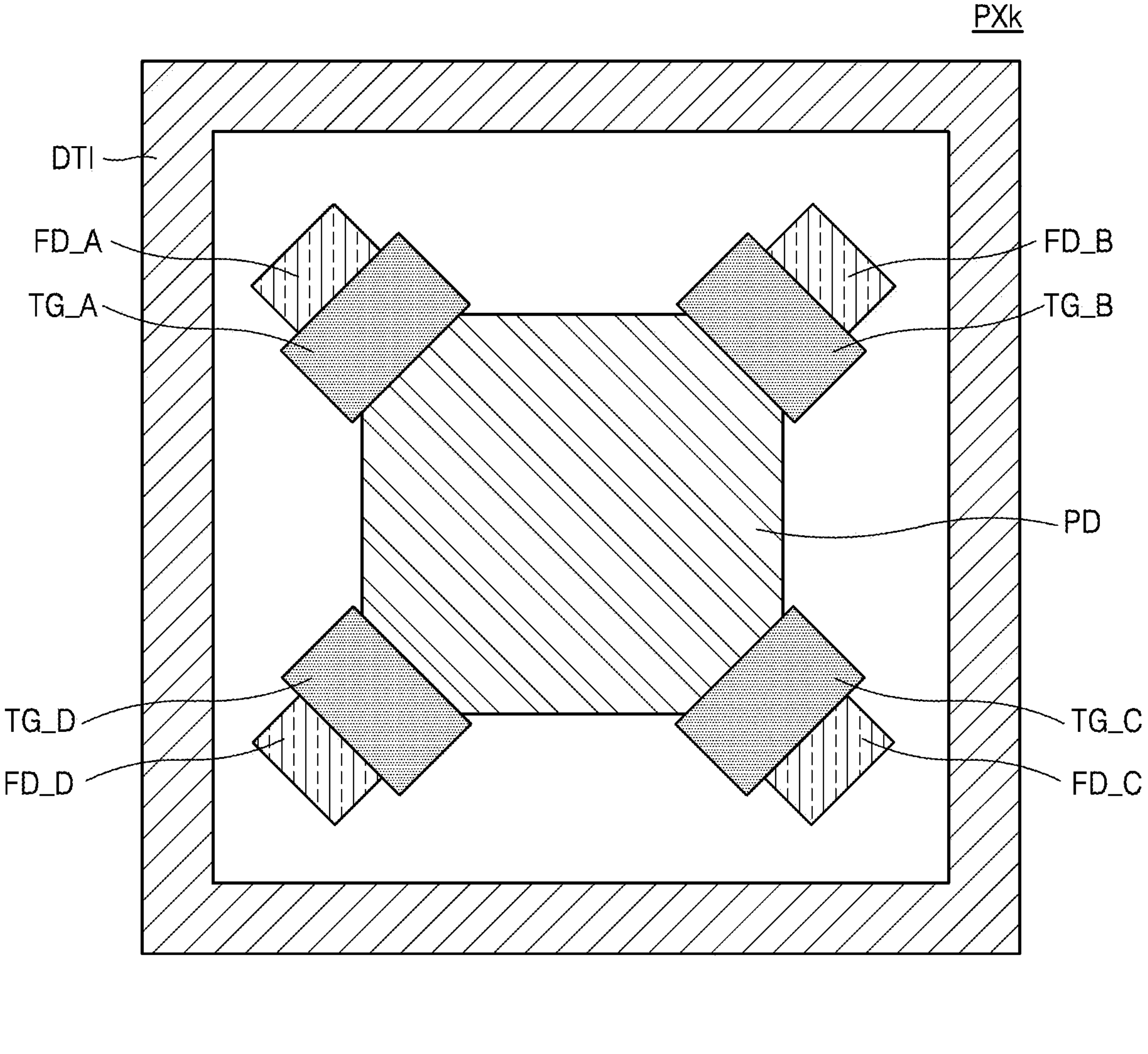
FIG. 17 is a diagram illustrating a layout of a unit pixel according to some example embodiments.

FIG. 17 is a diagram illustrating an equivalent circuit of a unit pixel PXk according to some example embodiments. FIG. 17 is a diagram illustrating a pixel PXk having a 4-tap structure. Descriptions which are the same as or similar to the descriptions of FIGS. 14 and 15 are omitted.

A DTI structure DTI may divide a pixel region in a 2D plane. In the pixel region, a photodiode PD, first to fourth transfer gates TG_A, TG_B, TG_C, and TG_D, and first to fourth floating diffusion nodes FD_A, FD_B, FD_C, and FD_D may be formed. The first transfer gate TG_A may be a gate of a transfer transistor TX_A of a first tap (e.g., see FIG. 3), the second transfer gate TG_B may be a gate of a transfer transistor TX_B of a second tap, the third transfer gate TG_C may be a gate of a transfer transistor TX_C of a third tap, and the fourth transfer gate TG_D may be a gate of a transfer transistor TX_D of a fourth tap. The first floating diffusion node FD_A may be a first tap floating diffusion node FD_A, the second floating diffusion node FD_B may be a second tap floating diffusion node FD_B, the third floating diffusion node FD_C may be a third tap floating diffusion node, and the fourth floating diffusion node FD_D may be a fourth tap floating diffusion node.

The first transfer gate TG_A and the first floating diffusion node FD_A may configure a first tap TA, the second transfer gate TG_B and the second floating diffusion node FD_B may configure a second tap TB, the third transfer gate TG_C and the third floating diffusion node FD_C may configure a third tap TC, and the fourth transfer gate TG_D and the fourth floating diffusion node FD_D may configure a fourth tap TD. The first to fourth transfer gates TG_A, TG_B, TG_C, and TG_D may be formed on the photodiode PD. The first to fourth transfer gates TG_A, TG_B, TG_C, and TG_D may be respectively connected to the first to fourth floating diffusion nodes FD_A, FD_B, FD_C, and FD_D.

The first to fourth transfer gates TG_A, TG_B, TG_C, and TG_D may be formed to be symmetric with one another. For example, the first and third transfer gates TG_A and TG_C may be formed at respective corner portions of the photodiode PD that are disposed diagonally with respect to each other, and the second and fourth transfer gates TG_B and TG_D may be formed at other respective corner portions of the photodiode PD that are disposed diagonally with respect to each other. As described above, the pixel PXk may have a phase symmetric structure of a 4-tap circuit.

Also, in some example embodiments, the photodiode PD, the first to fourth transfer gates TG_A, TG_B, TG_C, and TG_D, and the first to fourth floating diffusion nodes FD_A, FD_B, FD_C, and FD_D of the pixel PXk may be disposed in an upper portion of the pixel structure in a vertical direction, and the other elements of the pixel PXk may be disposed in a lower portion of the pixel structure in the vertical direction.

Figure 18:
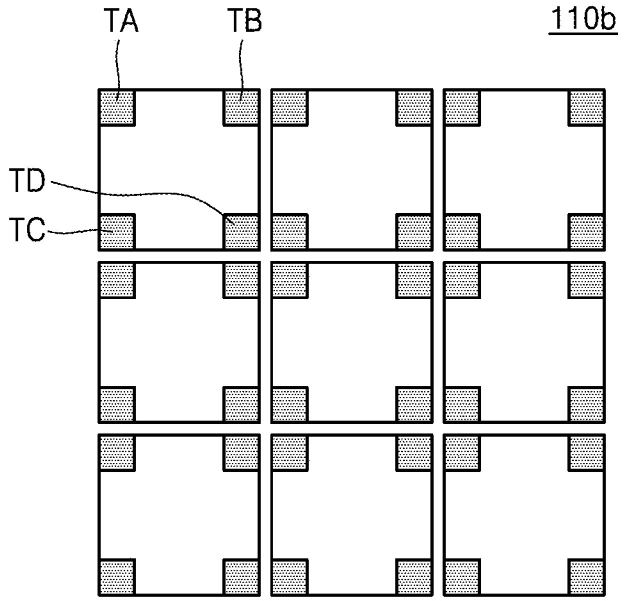
FIG. 18 is a diagram illustrating a layout of a pixel array according to some example embodiments.

FIG. 18 is a diagram illustrating a layout of a pixel array 110*b* according to some example embodiments. Descriptions which are the same as or similar to the descriptions of FIG. 16 are omitted.

Referring to FIG. 18, in the pixel array 110*b*, each of a plurality of pixels may include a first tap TA, a second tap TB, a third tap TC, and a fourth tap TD.

In the plurality of pixels of the pixel array 110*b*, the first tap TA, the second tap TB, the third tap TC, and the fourth tap TD may be arranged to be symmetric with one another. For example, the first and fourth taps TA and TD may be formed at respective corner portions of the pixels that are disposed diagonally with respect to each other, and the second and third taps TB and TC may be formed at other respective corner portions of the pixels that are disposed diagonally with respect to each other. For example, the first taps TA and the second taps TB may be disposed in a left portion of the pixels, and the third taps TC and the fourth taps TD may be disposed in a right portion of the pixels.

Figure 19:
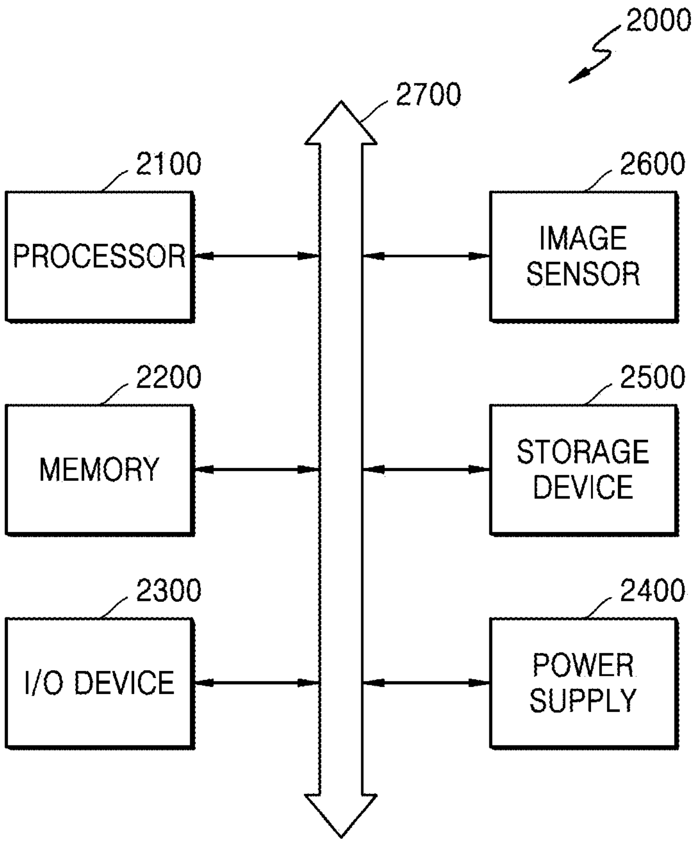
FIG. 19 is a block diagram schematically illustrating a computer system including an image sensor, according to some example embodiments.

FIG. 19 is a block diagram schematically illustrating a computer system 2000 including an image sensor, according to some example embodiments.

Referring to FIG. 19, the computer system 2000 may include a processor 2100, a memory 2200, an input/output (I/O) device 2300, a power supply 2400, a storage device 2500, an image sensor 2600, and a system bus 2700. The processor 2100, the memory 2200, the I/O device 2300, the power supply 2400, the storage device 2500, and the image sensor 2600 may communicate with each other through the system bus 2700.

The processor 2100 may be implemented as a microprocessor, a central processing unit (CPU), an application specific integrated circuit (ASIC) of an arbitrary different type, or an application processor (AP).

The memory 2200 may be implemented as a volatile memory and/or a non-volatile memory.

The I/O device 2300 may include an input device or apparatus such as a keyboard, a keypad, and a mouse, and an output device or apparatus such as a printer and a display.

The power supply 2400 may supply an operation voltage needed for an operation of the computer system 2000.

The storage device 2500 may include a solid state drive (SSD), a hard disk drive (HDD), and compact disc-read only memory (CD-ROM).

The image sensor 2600 may be the same as the image sensor 1 illustrated in FIG. 1. The image sensor 2600 according to some example embodiments may include a pixel array including a plurality of pixels each having a multi-tap structure. Because each of the pixels has the multi-tap structure, the pixel PXa may support various CNN operation functions of an image signal processor, and a delay time caused by the transfer and reception of data between the processor 2100 and the image signal processor may be reduced and/or minimized.

Figure 20:
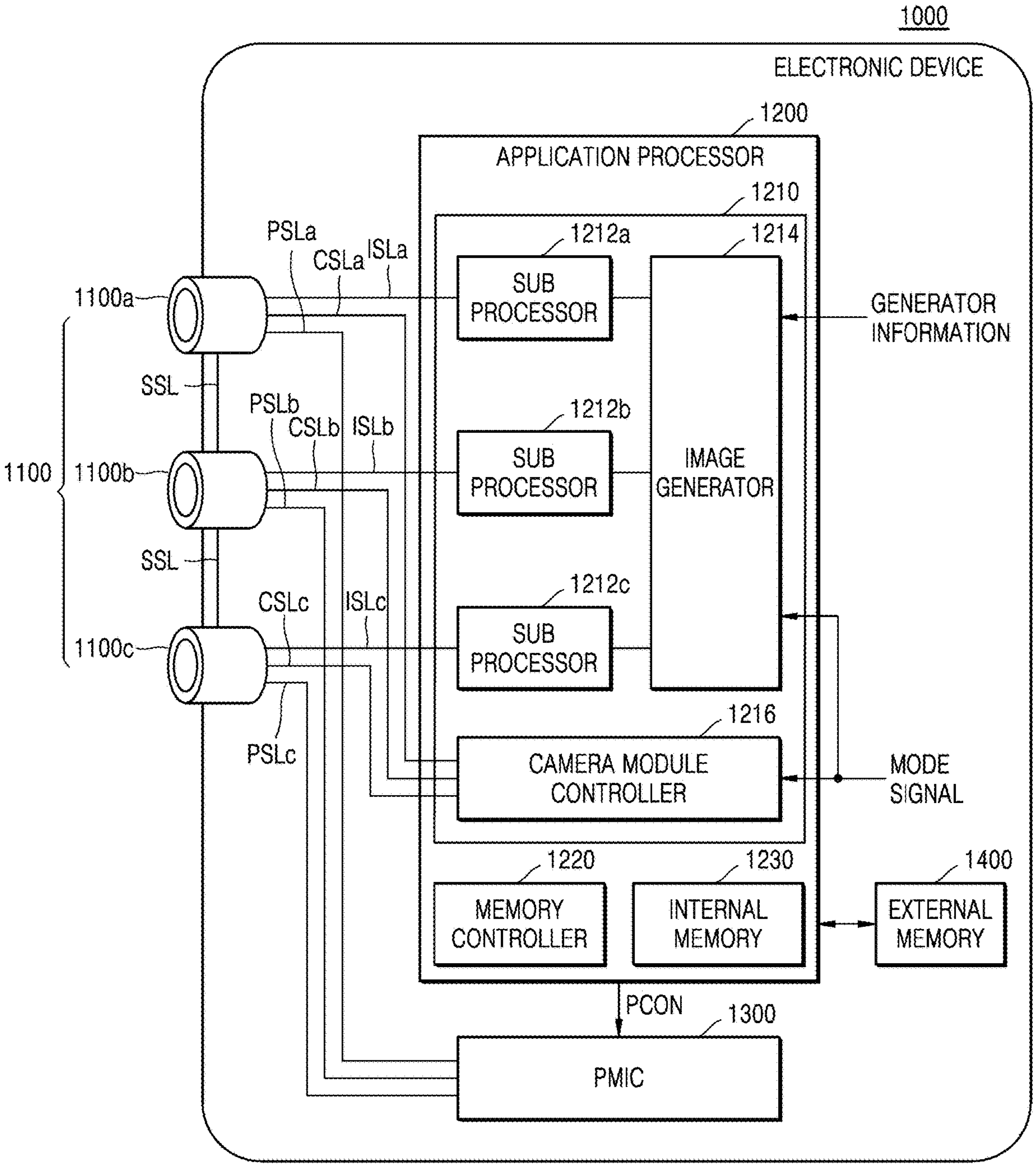
FIG. 20 is a block diagram of an electronic device including a multi camera module.
Figure 21:
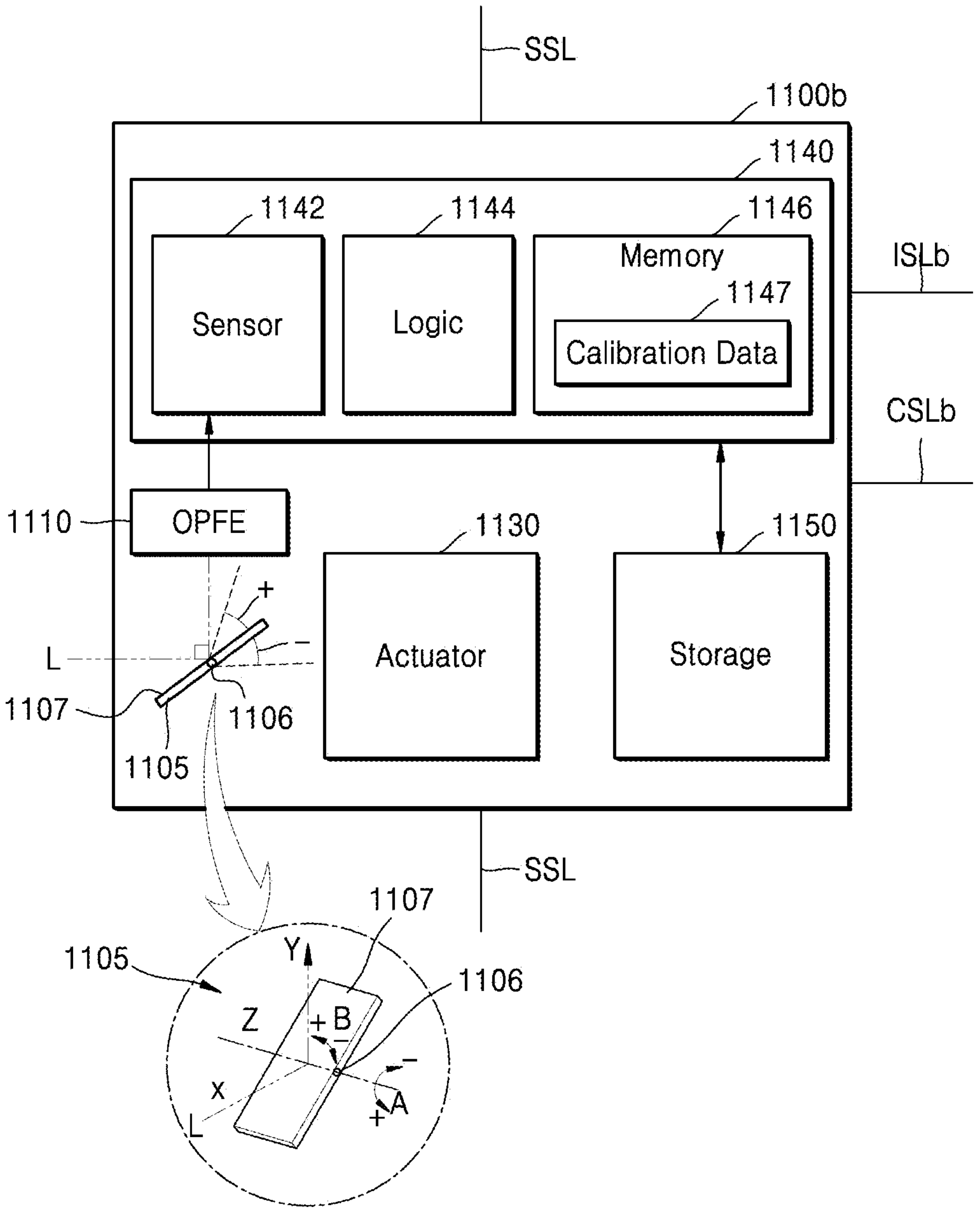
FIG. 21 is a detailed block diagram of the camera module of FIG. 20.

FIG. 20 is a block diagram of an electronic device 1000 including a multi camera module. FIG. 21 is a detailed block diagram of the camera module of FIG. 20.

Referring to FIG. 20, the electronic device 1000 may include a camera module group 1100, an application processor 1200, a power management integrated circuit (PMIC) 1300, and an external memory 1400.

The camera module group 1100 may include a plurality of camera modules 1100*a* to 1100*c*. Some example embodiments where three camera modules 1100*a* to 1100*c* are provided is illustrated in the drawing, but some other example embodiments are not limited thereto. In some example embodiments, the camera module group 1100 may be modified to include only two camera modules. Also, in some example embodiments, the camera module group 1100 may be modified to include k (where k may be a natural number of 4 or more) number of camera modules.

Hereinafter, a detailed configuration of the camera module 1100*b* will be described in more detail with reference to FIG. 21, and the following descriptions may be applied to the other camera modules 1100*a* and 1100*b* according to an example embodiments.

Referring to FIG. 21, the camera module 1100*b* may include a prism 1105, an optical path folding element (OPFE) 1110, an actuator 1130, an image sensing device 1140, and a storage 1150.

The prism 1105 may include a reflection surface 1107 of a light reflecting material and may change a path of light L incident from the outside.

In some example embodiments, the prism 1105 may change a path of the light L, which is incident in a first direction X, to a second direction Y which is perpendicular to the first direction X. Also, the prism 1105 may rotate the reflection surface 1107 of the light reflecting material in an A direction with respect to a center axis 1106, or may rotate the center axis 1106 in a B direction to change the path of the light L, which is incident in the first direction X, to the second direction Y perpendicular thereto. The OPFE 1110 may move in a third direction Z which is perpendicular to the first direction X and the second direction Y.

In some example embodiments, as illustrated, an A-direction maximum rotation angle of the prism 1105 may be about 15 degrees or less in a positive (+) A direction and may be greater than about 15 degrees in a negative (−) A direction, but some example embodiments are not limited thereto.

In some example embodiments, the prism 1105 may move by about 20 degrees, by about 10 degrees to about 20 degrees, or by about 15 degrees to about 20 degrees in a positive (+) or negative (−) B direction, and in some example embodiments, a moving angle may be the same angle in the positive (+) or negative (−) B direction, or may be an angle which is almost similar to a range of about 1 degree.

In some example embodiments, the prism 1105 may move in the third direction (for example, a Z direction) parallel to an extension direction of the center axis 1106.

The OPFE 1110 may include, for example, optical lenses which are divided into m (where m may be a natural number) number of groups. Also, the m lenses may move in the second direction Y and may change an optical zoom ratio of the camera module 1100*b*. For example, in some example embodiments where a basic optical zoom ratio of the camera module 1100*b* is ZR, when m number of optical lenses included in the OPFE 1110 move, an optical zoom ratio of the camera module 1100*b* may be changed to an optical zoom ratio of 3ZR, 5ZR, or 5ZR or more.

The actuator 1130 may move the OPFE 1110 or the optical lens (hereinafter referred to as an optical lens) to a certain position. For example, the actuator 1130 may adjust a position of the optical lens so that the image sensor 1142 is disposed at a focal length of the optical lens, for accurate sensing.

The image sensing device 1140 may include an image sensor 1142, a control logic (e.g., control logic circuit) 1144, and a memory 1146. The image sensor 1142 may sense an image of a sensing target by using the light L provided through the optical lens. The pixel and the pixel array described above with reference to FIGS. 2 to 18 may be applied to the image sensor 1142. Each pixel may include a plurality of subpixels (for example, four subpixels) including a plurality of floating diffusion regions and a plurality of photoelectric conversion devices, and the plurality of floating diffusion regions of the plurality of subpixels may be electrically connected to each other through a wiring. The sensitivity of the plurality of subpixels may be enhanced. Accordingly, the image quality and resolution of the image sensor 1142 may be enhanced.

The control logic 1144 may control an overall operation of the camera module 1100*b*. For example, the control logic 1144 may control an operation of the camera module 1100*b*, based on a control signal provided through a control signal line CSLb.

The memory 1146 may store information, needed for an operation of the camera module 1100*b*, such as calibration data 1147. The calibration data 1147 may include information which is needed for the camera module 1100*b* to generate image data by using the light L provided from the outside. The calibration data 1147 may include, for example, information about the degree of rotation, information about a focal length, and information about an optical axis, each described above. In some example embodiments where the camera module 1100*b* is implemented as a multi-state camera where a focal length varies based on a position of an optical lens, the calibration data 1147 may include information associated with auto focusing and a position-based (or state-based) focal length value of the optical lens.

The storage 1150 may store image data sensed through the image sensor 1142. The storage 1150 may be disposed outside the image sensing device 1140 and may be implemented as a stacked type with a sensor chip configuring the image sensing device 1140.

In some example embodiments, the storage 1150 may be implemented with electrically erasable programmable read-only memory (EEPROM), but some other example embodiments are not limited thereto. In some example embodiments, the image sensor 1142 may be configured with a pixel array, and the control logic 1144 may include an analog-to-digital converter (ADC) and an image signal processor for processing a sensed image.

Referring to FIGS. 20 and 21, in some example embodiments, each of the plurality of camera modules 1100*a* to 1100*c* may include the actuator 1130. Therefore, each of the plurality of camera modules 1100*a* to 1100*c* may include the same or different pieces of calibration data 1147 based on an operation of the actuator 1130 included therein.

In some example embodiments, one (for example, the camera module 1100*b*) of the plurality of camera modules 1100*a* to 1100*c* may be a camera module of a folded lens type including the prism 1105 and the OPFE 1110 described above, and the other camera modules (for example, 1100*a* and 1100*c*) may be camera modules of a vertical type which does not include the prism 1105 and the OPFE 1110, but some other example embodiments are not limited thereto.

One (for example, the camera module 1100*c*) of the plurality of camera modules 1100*a* to 1100*c* may be the camera module 30 illustrated in FIG. 1.

The image sensor according to some example embodiments may include a pixel array including a plurality of pixels each having a multi-tap structure. Because each of the pixels has the multi-tap structure, the pixel PXa may support various CNN operation functions of an image signal processor, and a delay time caused by the transfer and reception of data between a processor and an image signal processor may be reduced and/or minimized.

In some example embodiments, at least two (for example, the camera modules 1100*a* and 1100*b*) of the plurality of camera modules 1100*a* to 1100*c* may have different fields of view. In some example embodiments, for example, optical lenses of at least two (for example, the camera modules 1100*a* and 1100*b*) of the plurality of camera modules 1100*a* to 1100*c* may differ, but some other example embodiments are not limited thereto.

Also, in some example embodiments, fields of view of the plurality of camera modules 1100*a* to 1100*c* may differ. For example, the camera module 1100*a* may be an ultra-wide camera, the camera module 1100*b* may be a wide camera, and the camera module 1100*c* may be a tele camera, but some other example embodiments are not limited thereto. In some example embodiments, optical lenses respectively included in the plurality of camera modules 1100*a* to 1100*c* may differ, but are not limited thereto.

In some example embodiments, the plurality of camera modules 1100*a* to 1100*c* may be disposed physically apart from one another. That is, instead of that the plurality of camera modules 1100*a* to 1100*c* divisionally use a sensing region of one image sensor 1142, an independent image sensor 1142 may be disposed in each of the plurality of camera modules 1100*a* to 1100*c*.

Referring again to FIG. 20, the application processor 1200 may include an image processing device 1210, a memory controller 1220, and an internal memory 1230. The application processor 1200 may be implemented apart from the plurality of camera modules 1100*a* to 1100*c*. For example, the application processor 1200 and the plurality of camera modules 1100*a* to 1100*c* may be implemented as separate semiconductor chips apart from one another.

The image processing device 1210 may include a plurality of sub image processors 1212*a* to 1212*c*, an image generator 1214, and a camera module controller 1216.

The image processing device 1210 may include a number of sub image processors 1212*a* to 1212*c* corresponding to the number of camera modules 1100*a* to 1100*c*.

Pieces of image data respectively generated from the camera modules 1100*a* to 1100*c* may be provided to corresponding sub image processors 1212*a* to 1212*c* through image signal lines ISLa to ISLc apart from one another. For example, the image data generated from the camera module 1100*a* may be provided to the sub image processor 1212*a* through the image signal line ISLa, the image data generated from the camera module 1100*b* may be provided to the sub image processor 1212*b* through the image signal line ISLb, and the image data generated from the camera module 1100*c* may be provided to the sub image processor 1212*c* through the image signal line ISLc. The transfer of image data, for example, may be performed by using a camera serial interface (CSI) based on a mobile industry processor interface (MIPI), but some example embodiments are not limited thereto.

Furthermore, in some example embodiments, one sub image processor may be disposed to correspond to a plurality of camera modules. For example, the sub image processor 1212*a* and the sub image processor 1212*c* may be integrated into one sub image processor instead of being implemented apart from each other as illustrated, and pieces of image data provided from the camera module 1100*a* and the camera module 1100*c* may be selected by a selection element (for example, a multiplexer) and may be provided to an integrated sub image processor. In some example embodiments, the sub image processor 1212*b* may not be integrated and may be provided with image data from the camera module 1100*b*.

Also, in some example embodiments, the image data generated from the camera module 1100*a* may be provided to the sub image processor 1212*a* through the image signal line ISLa, the image data generated from the camera module 1100*b* may be provided to the sub image processor 1212*b* through the image signal line ISLb, and the image data generated from the camera module 1100*c* may be provided to the sub image processor 1212*c* through the image signal line ISLc. Also, image data obtained through processing by the sub image processor 1212*b* may be directly provided to the image generator 1214, and one piece of image data of image data obtained through processing by the sub image processor 1212*a* and image data obtained through processing by the sub image processor 1212*c* may be selected by a selection element (for example, a multiplexer) and may be provided to the image generator 1214.

Each of the sub image processors 1212*a* to 1212*c* may perform image processing such as bad pixel correction, 3A control (for example, auto-focus correction, auto-white balance, and auto-exposure), noise reduction, sharpening, gamma control, and remosaic on image data provided from a corresponding camera module of the camera modules 1100*a* to 1100*c*.

In some example embodiments, remosaic signal processing may be performed by each of the camera modules 1100*a* to 1100*c*, and then, a corresponding signal may be provided to the sub image processors 1212*a* to 1212*c*.

Image data obtained through processing by each of the sub image processors 1212*a* to 1212*c* may be provided to the image generator 1214. The image generator 1214 may generate an output image by using the image data provided from each of the sub image processors 1212*a* to 1212*c*, based on image generating information (e.g., generator information) or a mode signal.

For example, the image generator 1214 may merge at least some of pieces of image data generated by the camera modules 1100*a* to 1100*c* having different fields of view to generate the output image, based on the image generating information or the mode signal. Also, the image generator 1214 may select one piece of image data from among the pieces of image data generated by the camera modules 1100*a* to 1100*c* having different fields of view to generate the output image, based on the image generating information or the mode signal.

In some example embodiments, the image generating information may include a zoom signal (or a zoom factor).

Also, in some example embodiments, the mode signal may be a signal based on a mode selected by a user.

When the image generating information is the zoom signal (or the zoom factor) and the camera modules 1100*a* to 1100*c* have different fields of view, the image generator 1214 may perform different operations, based on the kind of zoom signal. For example, when the zoom signal is a first signal, the image generator 1214 may generate the output image by using the image data output from the sub image processor 1212*b* and the image data output from the sub image processor 1212*a* among the image data output from the sub image processor 1212*a* and the image data output from the sub image processor 1212*c*. For example, when the zoom signal is a second signal which differs from the first signal, the image generator 1214 may generate the output image by using the image data output from the sub image processor 1212*b* and the image data output from the sub image processor 1212*c* among the image data output from the sub image processor 1212*a* and the image data output from the sub image processor 1212*c*. For example, when the zoom signal is a third signal which differs from the first and second signals, the image generator 1214 may select one piece of image data from among the pieces of image data output from the sub image processors 1212*a* to 1212*c*, without performing image data mergence. However, some example embodiments are not limited thereto, and depending on the case, a method of processing image data may be variously modified and embodied.

In some example embodiments, the image processing device 1210 may further include a selector which selects outputs of the sub image processors 1212*a* to 1212*c* and transfers the selected output to the image generator 1214.

In some example embodiments, the selector may perform different operations, based on the zoom signal or the zoom factor. For example, when the zoom signal is a fourth signal (for example, a zoom ratio is a first zoom ratio), the selector may select one output from among the outputs of the sub image processors 1212*a* to 1212*c* and may transfer the selected output to the image generator 1214.

Also, when the zoom signal is a fifth signal which differs from the fourth signal (for example, a zoom ratio is a second zoom ratio), the selector may sequentially transfer p (where p may be a natural number of 2 or more) number of outputs among the outputs of the sub image processors 1212*a* to 1212*c* to the image generator 1214. For example, the selector may sequentially transfer the outputs of the sub image processor 1212*b* and the sub image processor 1212*c* to the image generator 1214. Also, the selector may sequentially transfer the outputs of the sub image processor 1212*a* and the sub image processor 1212*b* to the image generator 1214. The image generator 1214 may merge the p outputs sequentially provided thereto to generate one output image.

Image processing such as demosaic, down scaling to video/preview resolution size, and high dynamic range (HDR) processing may be previously performed by the sub image processors 1212*a* to 1212*c*, and then, processed image data may be transferred to the image generator 1214. Accordingly, even when the processed image data is provided to the image generator 1214 through one signal line by using the selector, an image mergence operation of the image generator 1214 may be performed at a high speed.

In some example embodiments, the image generator 1214 may receive pieces of image data having different exposure times from at least one of the plurality of sub image processors 1212*a* to 1212*c* and may perform HDR processing on the pieces of image data, thereby generating merged image data where a dynamic range has increased.

The camera module controller 1216 may provide a control signal to each of the camera modules 1100*a* to 1100*c*. The control signal generated from the camera module controller 1216 may be provided to corresponding camera modules 1100*a* to 1100*c* through the control signal lines CSLa to CSLc apart from one another.

Based on the mode signal or the image generating information including the zoom signal, one of the plurality of camera modules 1100*a* to 1100*c* may be designed as a master camera (for example, 1100*b*), and the other camera modules (for example, 1100*a* and 1100*c*) may be designed as slave cameras. Such information may be added to the control signal and may be provided to the corresponding camera modules 1100*a* to 1100*c* through the control signal lines CSLa to CSLc apart from one another.

A camera module operating as a master and a slave may be changed based on the zoom factor or an operation mode signal. For example, when a field of view of the camera module 1100*a* is wider than a field of view of the camera module 1100*b* and the zoom factor represents a zoom ratio, the camera module 1100*b* may operate as a master, and the camera module 1100*a* may operate as a slave. On the other hand, when the zoom factor represents a high zoom ratio, the camera module 1100*a* may operate as a master, and the camera module 1100*b* may operate as a slave.

In some example embodiments, the control signal provided from the camera module controller 1216 to each of the camera modules 1100*a* to 1100*c* may include a sync enable signal. For example, when the camera module 1100*b* is a master camera and the camera modules 1100*a* and 1100*c* are slave cameras, the camera module controller 1216 may transfer the sync enable signal to the camera module 1100*b*. The camera module 1100*b* provided with the sync enable signal may generate a sync signal, based on the sync enable signal, and may provide the generated sync signal to the camera modules 1100*a* and 1100*c* through a sync signal line SSL. The camera module 1100*b* and the camera modules 1100*a* and 1100*c* may transfer the image data to the application processor 1200 in synchronization with the sync signal.

In some example embodiments, the control signal provided from the camera module controller 1216 to each of the camera modules 1100*a* to 1100*c* may include mode information based on the mode signal. Based on the mode information, the plurality of camera modules 1100*a* to 1100*c* may operate in a first operation mode and a second operation mode in association with a sensing speed.

In the first operation mode, the plurality of camera modules 1100*a* to 1100*c* may generate an image signal at a first speed (for example, generate an image signal having a first frame rate), encode the generated image signal at a second speed which is higher than the first speed (for example, encode an image signal having a second frame rate which is higher than the first frame rate), and transfer an encoded image signal to the application processor 1200. In some example embodiments, the second speed may be 30 times the first speed.

The application processor 1200 may store the transferred image signal (e.g., the encoded image signal) in the memory 1230 or the storage 1400 outside the application processor 1200, and then, may decode the encoded image signal from the memory 1230 or the storage 1400 and may display image data generated based on a decoded image signal. For example, a corresponding sub image processor of the plurality of sub image processors 1212*a* to 1212*c* of the image processing device 1210 may perform decoding, and moreover, may perform image processing on the decoded image signal.

In the second operation mode, the plurality of camera modules 1100*a* to 1100*c* may generate an image signal at a third speed which is lower than the first speed (for example, generate an image signal having a third frame rate which is lower than the first frame rate) and may transfer the generated image signal to the application processor 1200. An image signal provided to the application processor 1200 may be a non-encoded signal. The application processor 1200 may perform image processing on the transferred image signal, or may store the image signal in the memory 1230 or the storage 1400.

The PMIC 1300 may supply power (for example, a source voltage) to each of the plurality of camera modules 1100*a* to 1100*c*. For example, based on control by the application processor 1200, the PMIC 1300 may supply first power to the camera module 1100*a* through a power signal line PSLa, supply second power to the camera module 1100*b* through a power signal line PSLb, and supply third power to the camera module 1100*c* through a power signal line PSLc.

In response to a power control signal PCON from the application processor 1200, the PMIC 1300 may generate power corresponding to each of the plurality of camera modules 1100*a* to 1100*c* and may control a level of the power. The power control signal PCON may include an operation mode-based power control signal of each of the plurality of camera modules 1100*a* to 1100*c*. For example, the operation mode may include a low power mode, and in some example embodiments, the power control signal PCON may include information about a set power level and a camera module operating in the low power mode. Levels of powers respectively supplied to the plurality of camera modules 1100*a* to 1100*c* may be equal to or different from one another. Also, a level of power may be dynamically changed.

One or more of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, an application-specific integrated circuit (ASIC), etc.

Hereinabove, some example embodiments have been described in the drawings and the specification. Some example embodiments have been described by using the terms described herein, but this has been merely used for describing the inventive concepts and has not been used for limiting a meaning or limiting the scope of the inventive concepts defined by the following claims. Therefore, it may be understood by those of ordinary skill in the art that various modifications and some other example embodiments may be implemented from the inventive concepts. Accordingly, the spirit and scope of the inventive concepts may be defined based on the spirit and scope of the following claims.

While the inventive concepts has been particularly shown and described with reference to some example embodiments thereof, it will be understood that various changes in form and details may be made therein without departing from the spirit and scope of the following claims.

What is claimed is:

1. An image sensor including a plurality of pixels, each of the plurality of pixels comprising:

a photodiode and a plurality of taps, wherein the photodiode is configured to generate an electric charge in response to a received optical signal, wherein each of the plurality of taps comprises a transfer transistor having a first terminal connected to the photodiode, the transfer transistor configured to turn on in response to a transfer gate signal;

a floating diffusion node connected to a second terminal of the transfer transistor, the floating diffusion node configured to accumulate photocharges generated by the photodiode;

a first source follower configured to amplify a voltage of the floating diffusion node and output an amplified voltage;

a first switch having a first terminal connected to the first source follower, and a second terminal connected to a first node;

a second switch having a first terminal connected to the first node, and a second terminal connected to a second node;

a first capacitor having a first terminal connected to the second switch, the first capacitor configured to store charges based on the amplified voltage; and a second source follower having a gate terminal connected to the second node.

2. The image sensor of claim 1, further comprising:

a controller configured to provide the transfer gate signal, wherein each of the plurality of taps further comprises, a first reset transistor connected to the floating diffusion node;

a bias transistor connected to the first node; and a first selection transistor connected to the second source follower, and during an integration period, the controller is configured to control an on/off ratio of the transfer gate signal to control an output voltage of each of the plurality of taps.

3. The image sensor of claim 2, wherein each of the plurality of taps further comprises:

a storage transistor connected to the transfer transistor; and a transfer control transistor connected to the storage transistor.

4. The image sensor of claim 2, wherein each of the plurality of taps further comprises:

a storage diode connected to the transfer transistor; and a transfer control transistor connected to the storage diode.

5. The image sensor of claim 2, wherein each of the plurality of taps further comprises:

a second capacitor having a first terminal connected to the second node, and a second terminal connected to a third node, the second capacitor configured to store the photocharges; and a second reset transistor connected to the third node, and the gate terminal of the second source follower being connected to the third node.

6. The image sensor of claim 2, wherein each of the plurality of taps further comprises:

a third switch having a first terminal connected to the first node, and a second terminal connected to a third node;

a second capacitor having a first terminal connected to the third node, the second capacitor configured to store a reset charge;

a third source follower connected to the third node; and a second selection transistor having a first terminal connected to the third source follower.

7. The image sensor of claim 1, wherein the plurality of taps comprise:

a first tap configured to output, in response to a first transfer gate signal, a first output voltage based on photocharges generated from the received optical signal; and a second tap configured to output, in response to a second transfer gate signal, a second output voltage based on the photocharges generated from the received optical signal, and during an integration period, the first transfer gate signal and the second transfer gate signal have logic levels complementary to each other.

8. The image sensor of claim 7, wherein the first tap and the second tap are at a same position on the photodiode.

9. The image sensor of claim 7, wherein the first tap and the second tap are arranged at positions on the photodiode symmetric with each other.

10. The image sensor of claim 1, wherein the plurality of taps comprise:

a first tap configured to output, in response to a first transfer gate signal, a first output voltage based on photocharges generated from the received optical signal;

a second tap configured to output, in response to a second transfer gate signal, a second output voltage based on the photocharges generated from the received optical signal;

a third tap configured to output, in response to a third transfer gate signal, a third output voltage based on the photocharges generated from the received optical signal; and a fourth tap configured to output, in response to a fourth transfer gate signal, a fourth output voltage based on the photocharges generated from the received optical signal.

11. The image sensor of claim 10, wherein the first tap, the second tap, the third tap, and the fourth tap are at positions on the photodiode symmetric with one another.

12. An image sensor including a pixel array in which a plurality of pixels are arranged, each of the plurality of pixels comprising:

a plurality of taps, wherein each of the plurality of taps comprises a transfer transistor having a first terminal connected to a photodiode, the transfer transistor configured to turn on in response to a transfer gate signal;

a floating diffusion node connected to a second terminal of the transfer transistor, the floating diffusion node configured to accumulate photocharges generated by the photodiode;

a first source follower configured to amplify a voltage of the floating diffusion node and output an amplified voltage;

a first switch having a first terminal connected to the first source follower, and a second terminal connected to a first node;

a second switch having a first terminal connected to the first node, and a second terminal connected to a second node;

a first capacitor having a first terminal connected to the second switch, the first capacitor configured to store charges based on the amplified voltage; and a second source follower having a gate terminal connected to the second node, and during an integration period, each tap is configured to control an on/off ratio of the transfer gate signal to control an output voltage of each of the plurality of taps.

13. The image sensor of claim 12, wherein each of the plurality of pixels is in a deep trench insulator (DTI) structure.

14. The image sensor of claim 12, wherein each of the plurality of taps further comprises:

a first reset transistor connected to the floating diffusion node;

a bias transistor connected to the first node; and a first selection transistor connected to the second source follower.

15. The image sensor of claim 14, wherein each of the plurality of taps comprises:

a first tap configured to output, in response to a first transfer gate signal, a first output voltage based on photocharges generated from a received optical signal; and a second tap configured to output, in response to a second transfer gate signal, a second output voltage based on the photocharges generated from the received optical signal, and during the integration period, the first transfer gate signal and the second transfer gate signal have logic levels complementary to each other.

16. The image sensor of claim 15, wherein the first tap is at a left portion of each pixel, and the second tap is at a right portion of each pixel.

17. The image sensor of claim 14, wherein each of the plurality of taps comprises:

a first tap configured to output, in response to a first transfer gate signal, a first output voltage based on photocharges generated from a received optical signal;

a second tap configured to output, in response to a second transfer gate signal, a second output voltage based on the photocharges generated from the received optical signal;

a third tap configured to output, in response to a third transfer gate signal, a third output voltage based on the photocharges generated from the received optical signal; and a fourth tap configured to output, in response to a fourth transfer gate signal, a fourth output voltage based on the photocharges generated from the received optical signal, and the first tap, the second tap, the third tap, and the fourth tap are being at positions on the photodiode symmetric with one another.

18. A camera module including an image sensor and an image signal processor, the image sensor comprising:

a pixel including a first tap and a second tap, wherein the first tap comprises a first transfer transistor connected to a first floating diffusion node, the first transfer transistor configured to turn on in response to a first transfer gate signal;

a first source follower configured to amplify a voltage of the first floating diffusion node and output a first amplified voltage;

a first switch having a first terminal connected to the first source follower, and a second terminal connected to a first node;

a second switch having a first terminal connected to the first node, and a second terminal connected to a second node;

a first capacitor having a first terminal connected to the second switch, the first capacitor configured to store charges based on the first amplified voltage; and a second source follower having a gate terminal connected to the second node, the second tap comprises a second transfer transistor connected to a second floating diffusion node, the second transfer transistor configured to turn on in response to a second transfer gate signal;

a third source follower configured to amplify a voltage of the second floating diffusion node and output a second amplified voltage;

a third switch having a first terminal connected to the third source follower, and a second terminal connected to a third node;

a fourth switch having a first terminal connected to the third node, and a second terminal connected to a fourth node;

a second capacitor having a first terminal connected to the fourth switch, the second capacitor configured to store charges based on the second amplified voltage; and a fourth source follower having a gate terminal connected to the fourth node, and during an integration period, output voltages of the first tap and the second tap are controlled by controlling on/off ratios of the first transfer gate signal and the second transfer gate signal.

19. The camera module of claim 18, wherein the pixel further comprises:

a third tap configured to output, in response to a third transfer gate signal, a third output voltage based on photocharges; and a fourth tap configured to output, in response to a fourth transfer gate signal, a fourth output voltage based on the photocharges.

20. The camera module of claim 19, wherein, during the integration period, each of phase differences between the first transfer gate signal, the second transfer gate signal, the third transfer gate signal, and the fourth transfer gate signal is 90 degrees.

* * * * *